US012721247B2

(12) United States Patent
Hirata

(10) Patent No.: US 12,721,247 B2

(45) Date of Patent: Aug. 25, 2026

(54) SEMICONDUCTOR DEVICE

(71) Applicant: ROHM CO., LTD., Kyoto (JP)

(72) Inventor: Shigeru Hirata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 399 days.

(21) Appl. No.: 18/451,423

(22) Filed: Aug. 17, 2023

(65) Prior Publication Data

US 2023/0395473 A1 Dec. 7, 2023

Related U.S. Application Data

(63) Continuation of application No. PCT/JP2022/005049, filed on Feb. 9, 2022.

(30) Foreign Application Priority Data

Feb. 22, 2021 (JP) ................................ 2021-026059

(51) Int. Cl.

*H10W 90/00* (2026.01)
*H10W 70/40* (2026.01)

(52) U.S. Cl.

CPC ........ *H10W 90/811* (2026.01); *H10W 70/421* (2026.01); *H10W 90/753* (2026.01); *H10W 90/755* (2026.01)

(58) Field of Classification Search

CPC ......... H01L 23/49582; H01L 23/49562; H01L 23/50; H01L 25/07; H01L 25/18; H01L 24/49; H01L 2224/0603; H01L 2224/06181; H01L 2224/32245; H01L 2224/48247; H01L 2224/4903;

(Continued)

(56) References Cited

U.S. PATENT DOCUMENTS 11,227,822 B2 * 1/2022 Hirata ................ H10W 70/481
2021/0151366 A1 5/2021 Hirata

FOREIGN PATENT DOCUMENTS

JP 3177455 U 7/2012
JP 2017-034079 2/2017

(Continued)

OTHER PUBLICATIONS

Office Action issued in corresponding German Patent Application No. 112022000862.8, Sep. 19, 2025, 11 pages w/translation.

(Continued)

*Primary Examiner* — Steven B Gauthier
*Assistant Examiner* — Marc-Anthony Armand
(74) *Attorney, Agent, or Firm* — HSML P.C.

(57) ABSTRACT

A semiconductor device includes: an IC; a first lead having an island portion to which the IC is bonded; a second lead having a band-shaped portion; a plurality of additional leads spaced apart from the second lead with the first lead therebetween, and electrically connected to the IC; and a plurality of wires bonded to the IC and the plurality of additional leads. As viewed in the thickness direction, each of the additional leads has an edge facing the island portion. As viewed in the thickness direction, the band-shaped portion has a pair of elongated edges. As viewed in the thickness direction, the edge of the additional lead located closest to the band-shaped portion is positioned between the pair of elongated edges in a predetermined direction perpendicular to the thickness direction.

17 Claims, 16 Drawing Sheets

(58) Field of Classification Search
CPC ......... H10W 72/07552; H10W 72/527; H10W 72/884; H10W 72/926; H10W 72/944; H10W 72/071; H10W 74/00; H10W 90/00; H10W 90/736; H10W 90/756; H10W 70/457; H10W 70/481
See application file for complete search history.

(56) References Cited

FOREIGN PATENT DOCUMENTS

JP 2017-174885 A 9/2017
WO WO2019203139 * 10/2019 ....... H01L 23/49575

OTHER PUBLICATIONS

International Search Report issued in International Application No. PCT/JP2022/005049, May 10, 2022, 2 pages.
Written Opinion issued in International Application No. PCT/JP2022/005049, May 10, 2022, 2 pages.
Office Action issued in corresponding Japanese Patent application No. 2023-500771, Feb. 10, 2026, and machine translation (6 pages).

* cited by examiner

SEMICONDUCTOR DEVICE

TECHNICAL FIELD

The present disclosure relates to a semiconductor device used for the drive control of a motor (e.g., brushless DC motor).

BACKGROUND ART

A semiconductor device used for the drive control of a motor is provided with a plurality of switching elements (e.g., MOSFETs) and an IC for driving the switching elements. JP-A-2017-34079 discloses an example of such a semiconductor device (see FIG. 11).

The semiconductor device disclosed in JP-A-2017-34079 is used for the drive control of a brushless DC motor. The conventional semiconductor device converts DC power into three-phase AC power, and therefore has six switching elements. Because these switching elements are aligned in a single direction (x direction shown in FIG. 11), the semiconductor device has an outer shape of a band elongated in the single direction. In such a configuration, a plurality of leads electrically connected to an IC are aligned in a single direction. As a result, the total length of a plurality of wires bonded to the IC and the leads becomes relatively long, causing a rise in the cost of the semiconductor device. Furthermore, using the single IC to drive and control the plurality of switching elements causes a signal that serves as a reference for the operations of the switching elements to be relatively simple. As a result, the efficiency of the motor drive control by the semiconductor device is lowered, and there is still room for improvement in this respect.

BRIEF DESCRIPTION OF THE DRAWINGS

FIG. 2 is a plan view illustrating the semiconductor device in FIG. 1.

DETAILED DESCRIPTION OF EMBODIMENTS

Embodiments of the present disclosure will be described with reference to the accompanying drawings.

Figure 3:
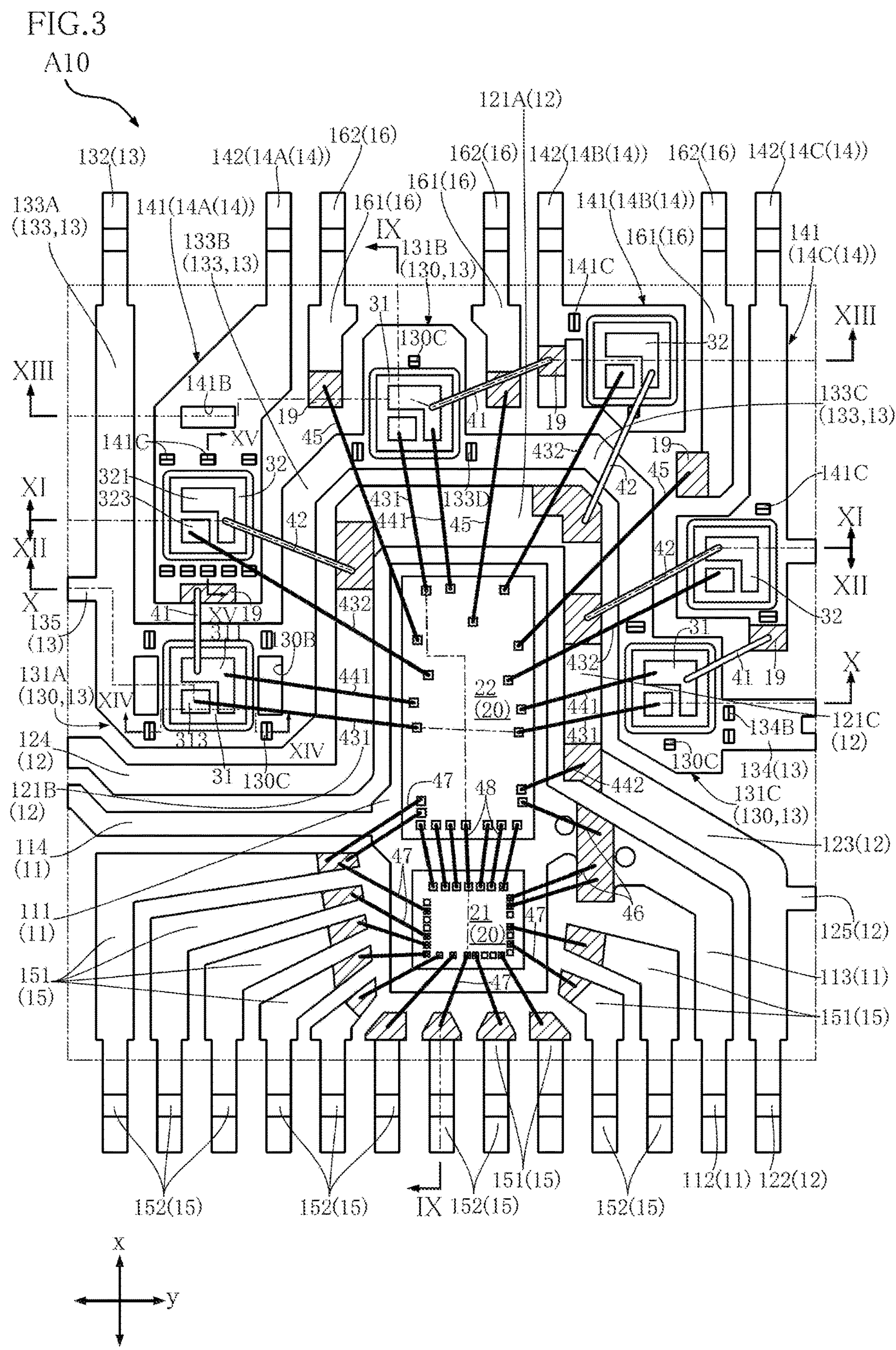
FIG. 3 is a plan view illustrating the semiconductor device in FIG. 1, with a sealing resin shown transparent.

The following describes a semiconductor device A10 according to a first embodiment of the present disclosure, with reference to FIGS. 1 to 18. The semiconductor device A10 includes a first lead 11, a second lead 12, a third lead 13, a plurality of fourth leads 14, a plurality of fifth leads a plurality of sixth leads 16, at least one integrated circuit (IC) 20, a plurality of first switching elements 31, a plurality of second switching elements 32, and a sealing resin 50. As described below, although two ICs (21, 22) are provided in the illustrated example, the present disclosure is not limited to this. The semiconductor device A10 further includes a plurality of first wires 41, a plurality of second wires 42, a plurality of first gate wires 431, a plurality of second gate wires 432, a plurality of first potential wires 441, a second potential wire 442, a plurality of boot wires a plurality of ground wires 46, a plurality of wires 47, and a plurality of relay wires 48. In FIG. 3, the sealing resin 50 is shown transparent for convenience of understanding. Furthermore, the sealing resin 50 in FIG. 3 is indicated by an imaginary line (two-dot chain line). FIGS. 9 to 15 are cross-sectional views taken along single-dot chain lines in FIG. 3.

In the description of the semiconductor device A10, the thickness direction of an island portion 111 of the first lead 11 is referred to as "thickness direction z" for convenience. A direction perpendicular to the thickness direction z is referred to as "first direction x", and the direction perpendicular to both of the thickness direction z and the first direction x is referred to as "second direction y".

Figure 1:
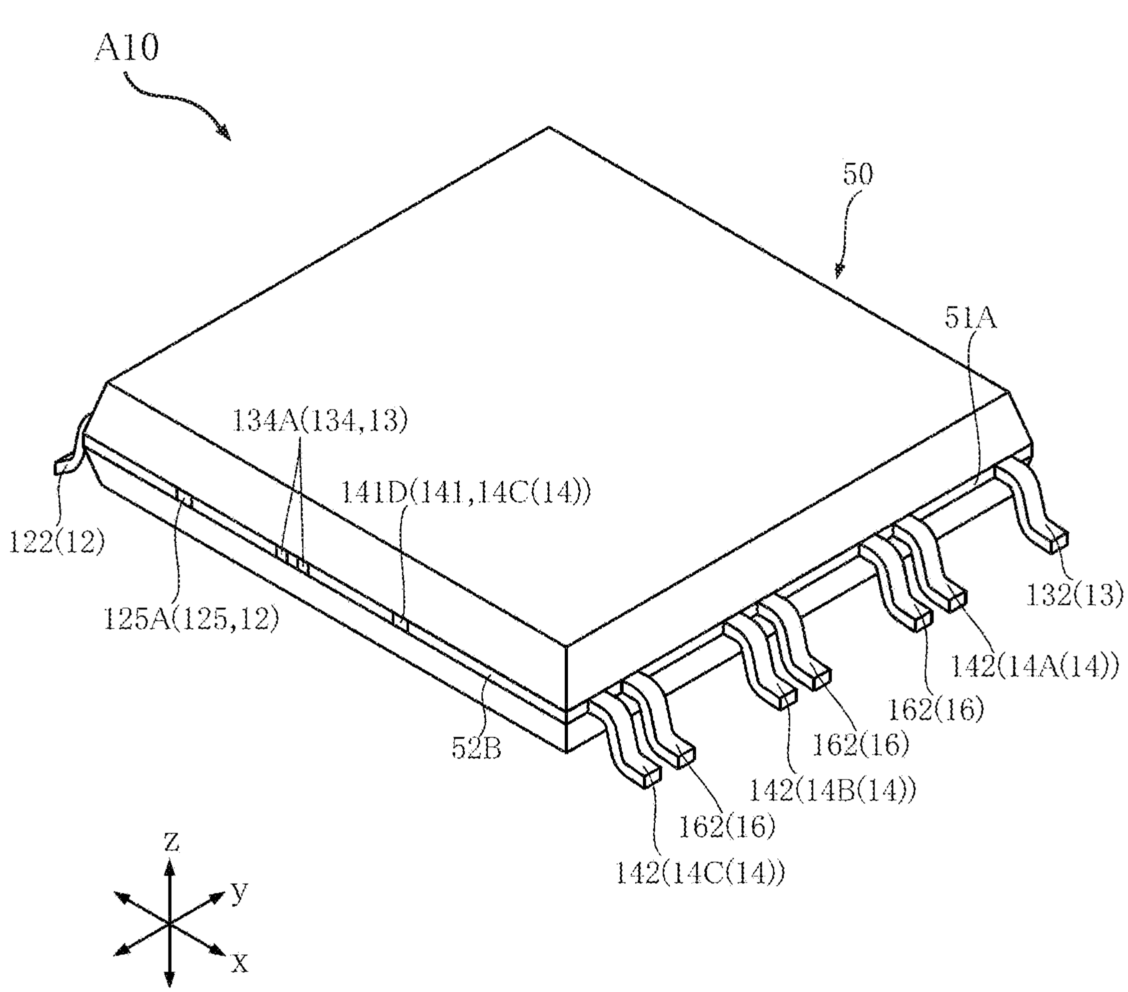
FIG. 1 is a perspective view illustrating a semiconductor device according to a first embodiment of the present disclosure.

The semiconductor device A10 shown in FIG. 1 converts the DC power supplied from the outside to the semiconductor device A10 into three-phase AC power by means of the first switching elements 31 and the second switching elements 32. The semiconductor device A10 can be used for the drive control of a brushless DC motor.

The first lead 11, the second lead 12, the third lead 13, the fourth leads 14, the fifth leads 15, and the sixth leads 16 are conductive members formed from the same lead frame. These conductive members form a part of the conduction path between a wiring board on which the semiconductor device A10 is mounted and each of the IC 20, the first switching elements 31 and the second switching elements 32. The lead frame is made of copper (Cu) or a copper alloy.

As shown in FIG. 3, the first lead 11 has an island portion 111, a first terminal portion 112, a first connecting portion 113, and a first suspending portion 114.

As shown in FIG. 3, the island portion 111 is elongated in the first direction x. In the illustrated example, the island portion 111 has a rectangular shape as viewed in the thickness direction z, and has a pair of long sides extending in the first direction x.

Figure 2:
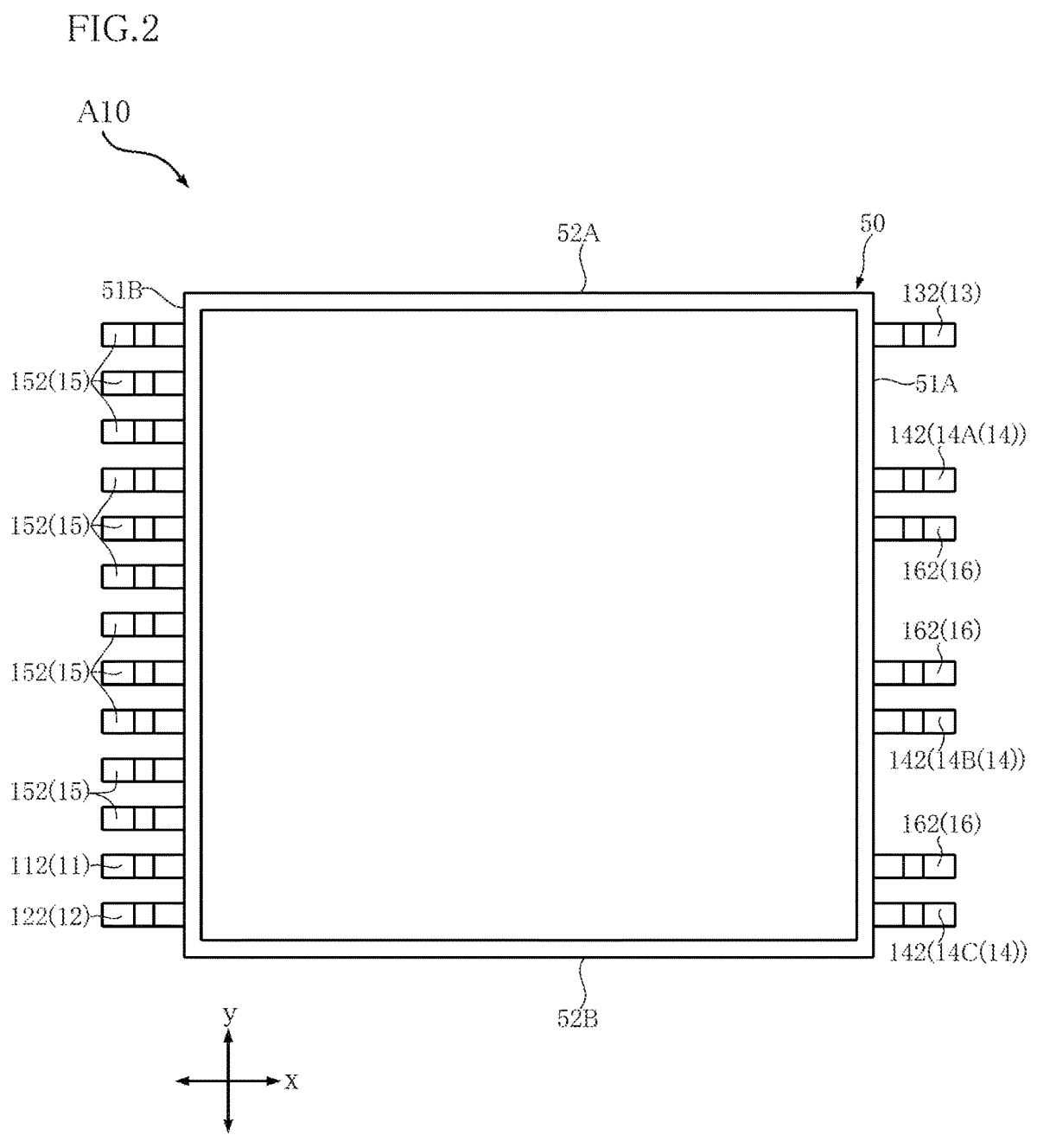
Figure 5:
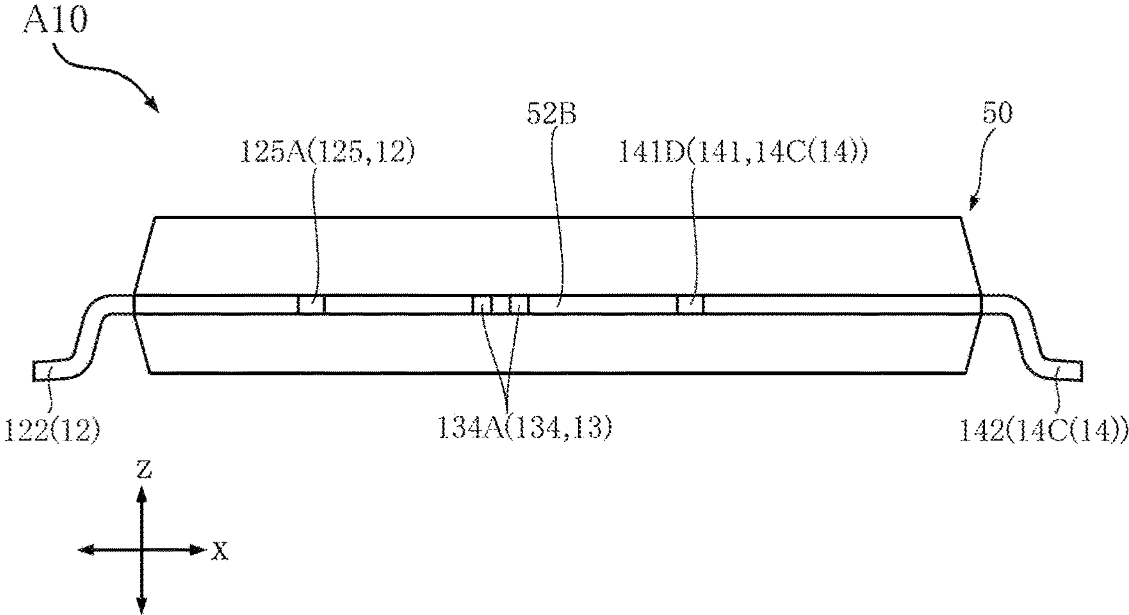
FIG. 5 is a front view illustrating the semiconductor device in FIG. 1.

As shown in FIGS. 2 and 3, the first terminal portion 112 protrudes from the sealing resin 50 in a second sense of the first direction x as viewed in the thickness direction z. As shown in FIG. 5, the first terminal portion 112 is bent into a hook shape as viewed in the second direction y. The first terminal portion 112 is covered with a tin (Sn) plating layer or a tin-silver (Ag) alloy plating layer, for example.

Figure 17:
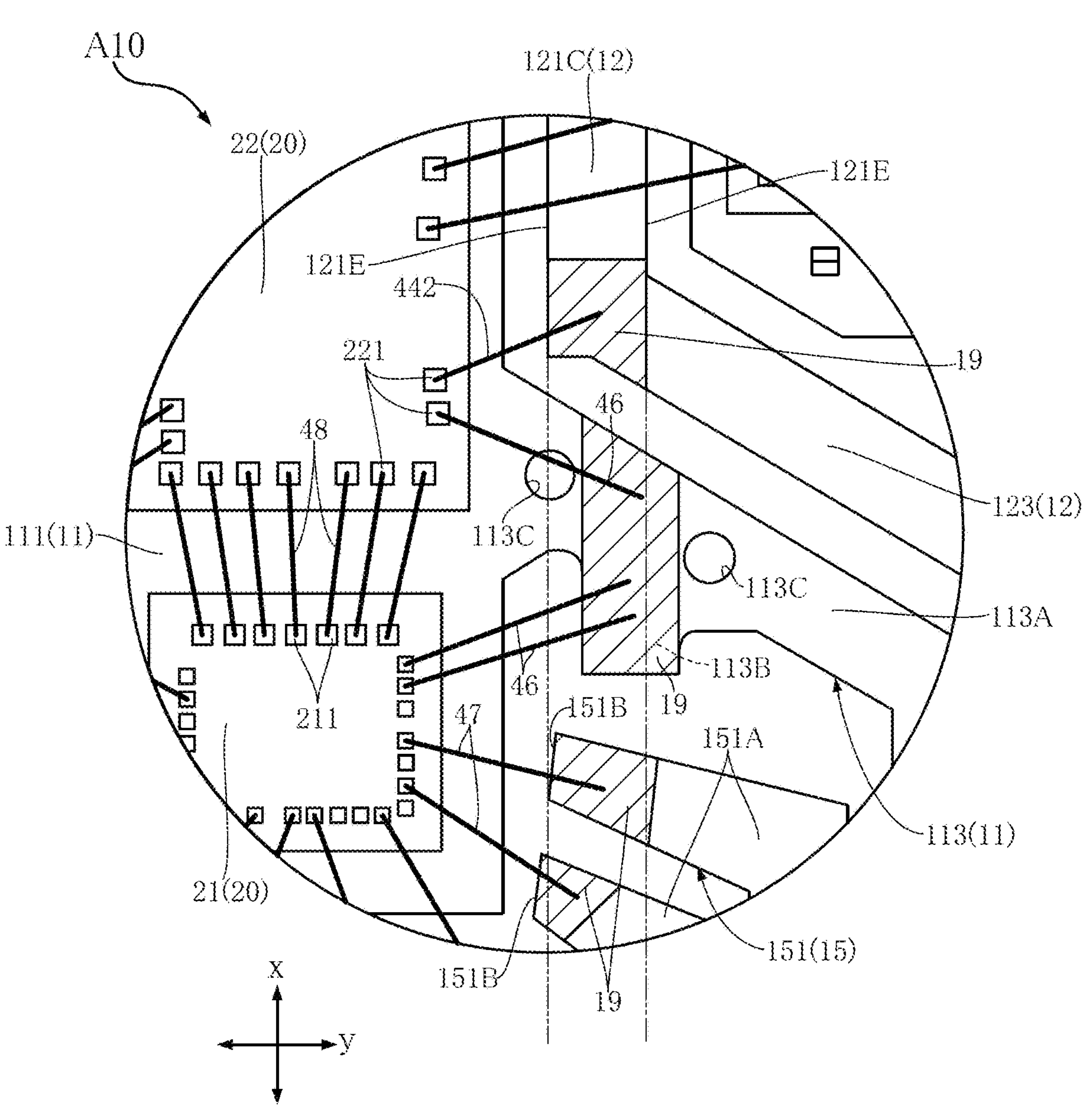
FIG. 17 is a partially enlarged view of FIG. 3.

As shown in FIG. 3, the first connecting portion 113 is connected to the island portion 111 and the first terminal portion 112. The first connecting portion 113 includes a region that is inclined relative to both of the first direction x and the second direction y. As shown in FIG. 17, the first connecting portion 113 has a base 113A and a tongue 113B. The base 113A is connected to the island portion 111 and the first terminal portion 112. The tongue 113B protrudes from the base 113A toward the fifth leads 15 in the first direction x. The base 113A is formed with a pair of holes 113C penetrating through the first connecting portion 113 in the thickness direction z. In the second direction y (as viewed in the first direction x), the tongue 113B is located between the pair of holes 113C.

As shown in FIG. 3, the first suspending portion 114 is located opposite from the first connecting portion 113 with respect to the island portion 111 in the second direction y. The first suspending portion 114 extends long (hereinafter, sometimes simply referred to as "extends") in the second direction y. Accordingly, the island portion 111 is flanked by the first connecting portion 113 and the first suspending portion 114 in the second direction y. The first suspending portion 114 has an end surface 114A facing in the second direction y and exposed from the sealing resin 50.

As shown in FIG. 3, the entirety of the second lead 12 is spaced apart from the first lead 11. Specifically, a large part of the second lead 12 is spaced apart from the first lead 11 in the first direction x, and the remaining part of the second lead 12 (the right-side linear portion extending in the first direction x) is spaced apart from the first lead 11 in the second direction y. In the illustrated example, the second lead 12 has a first band-shaped portion 121A, a second band-shaped portion 121B, a third band-shaped portion 121C, a second terminal portion 122, a second connecting portion 123, a second suspending portion 124, and a second auxiliary suspending portion 125.

Figure 4:
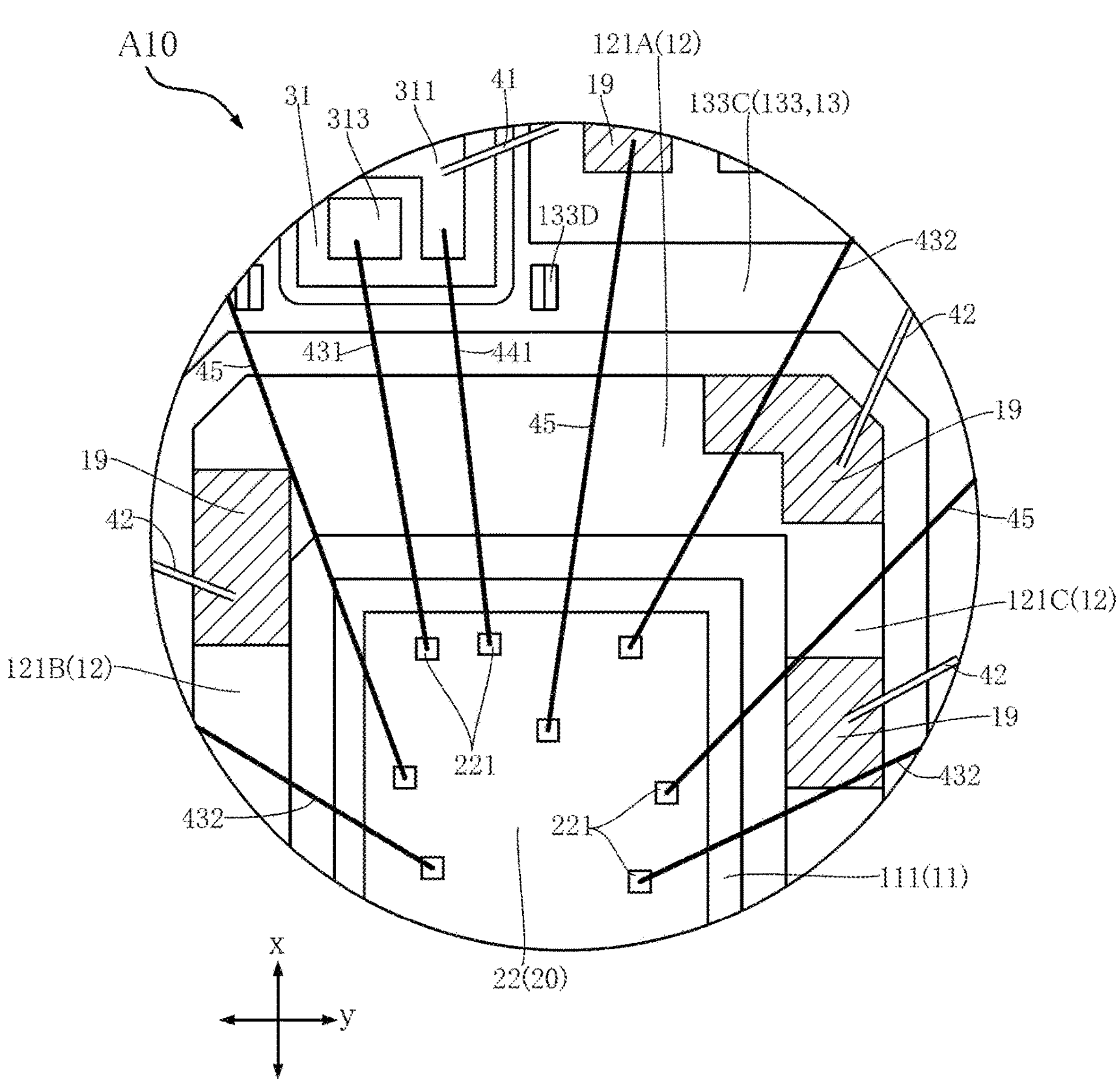
FIG. 4 is a partially enlarged view of FIG. 3.
Figure 10:
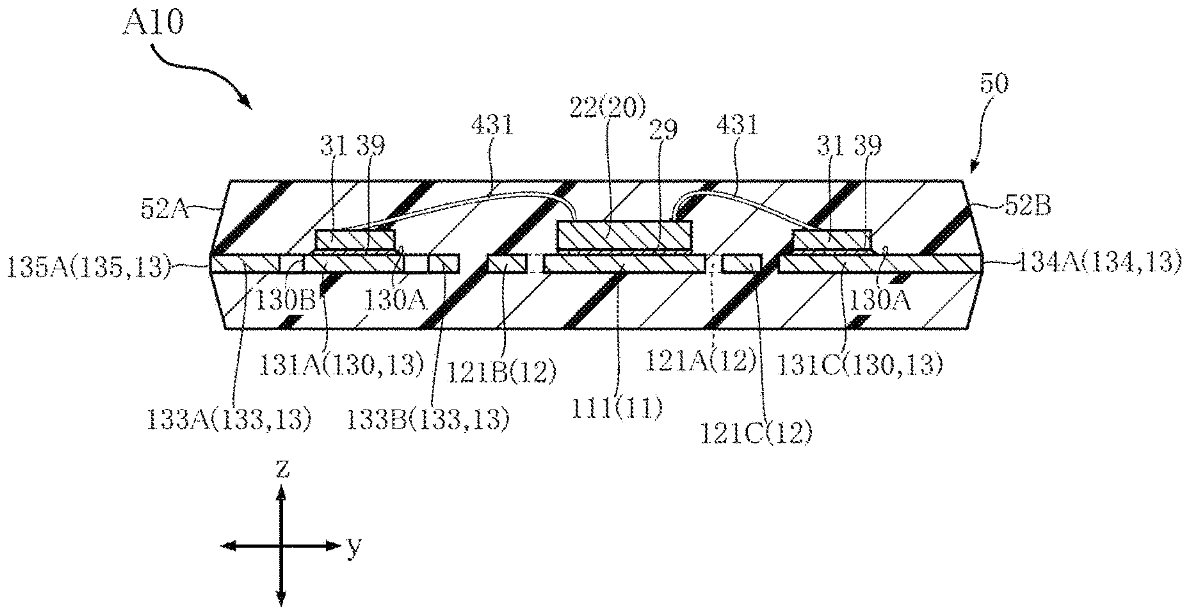
FIG. 10 is a cross-sectional view taken along line X-X in FIG. 3.

As shown in FIGS. 3 and 4, the first band-shaped portion 121A is spaced apart from the island portion 111 of the first lead 11 in the first direction x. The first band-shaped portion 121A extends in the second direction y. As shown in FIG. 10, the island portion 111 overlaps with the first band-shaped portion 121A as viewed in the first direction x.

As shown in FIGS. 3 and 4, the first band-shaped portion 121A has two end portions (regions) spaced apart from each other in the second direction y. The second band-shaped portion 121B is connected to one of the two end portions of the first band-shaped portion 121A and extends in the first direction x. As shown in FIG. 3, the first suspending portion 114 of the first lead 11 is located next to the second band-shaped portion 121B in the first direction x. The third band-shaped portion 121C is connected to the other one of the two end portions of the first band-shaped portion 121A and extends in the first direction x. The first connecting portion 113 of the first lead 11 is located next to the third band-shaped portion 121C in the first direction x. At least a part of the island portion 111 of the first lead 11 is flanked by the second band-shaped portion 121B and the third band-shaped portion 121C in the second direction y.

As shown in FIGS. 2 and 3, the second terminal portion 122 protrudes from the sealing resin 50 in the second sense of the first direction x as viewed in the thickness direction z. As with the first terminal portion 112 shown in FIG. 5, the second terminal portion 122 is bent into a hook shape as viewed in the second direction y. The second terminal portion 122 is positioned next to the first terminal portion 112 in the second direction y. The second terminal portion 122 is covered with a tin plating layer or a tin-silver alloy plating layer, for example.

As shown in FIG. 3, the second connecting portion 123 is connected to the third band-shaped portion 121C and the second terminal portion 122. The second connecting portion 123 is located next to the first connecting portion 113 of the first lead 11. The second connecting portion 123 includes a region that is inclined relative to both of the first direction x and the second direction y.

As shown in FIG. 3, the second suspending portion 124 is connected to the second band-shaped portion 121B and extends in the second direction y. The second suspending portion 124 is located next to the first suspending portion 114 of the first lead 11. The second suspending portion 124 has an end surface 124A facing in the second direction y and exposed from the sealing resin 50.

As shown in FIG. 3, the second connecting portion 123 includes a region extending in the first direction x, and the second auxiliary suspending portion 125 extends from the region in the second direction y. The second auxiliary suspending portion 125 has an end surface 125A facing in the second direction y and exposed from the sealing resin 50.

As shown in FIG. 3, the third lead 13 is spaced apart from the first lead 11 with the second lead 12 interposed therebetween. The third lead 13 has a plurality of first mounting portions 130, a third terminal portion 132, a third connecting portion 133, a third suspending portion 134, and a third auxiliary suspending portion 135.

Figure 9:
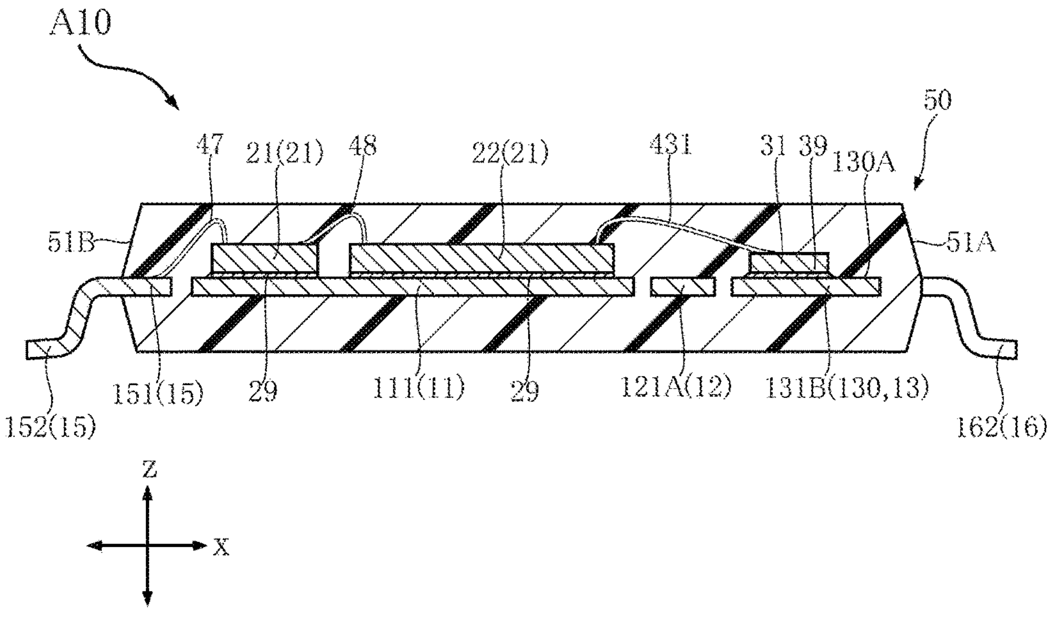
FIG. 9 is a cross-sectional view taken along line IX-IX in FIG. 3.
Figure 14:
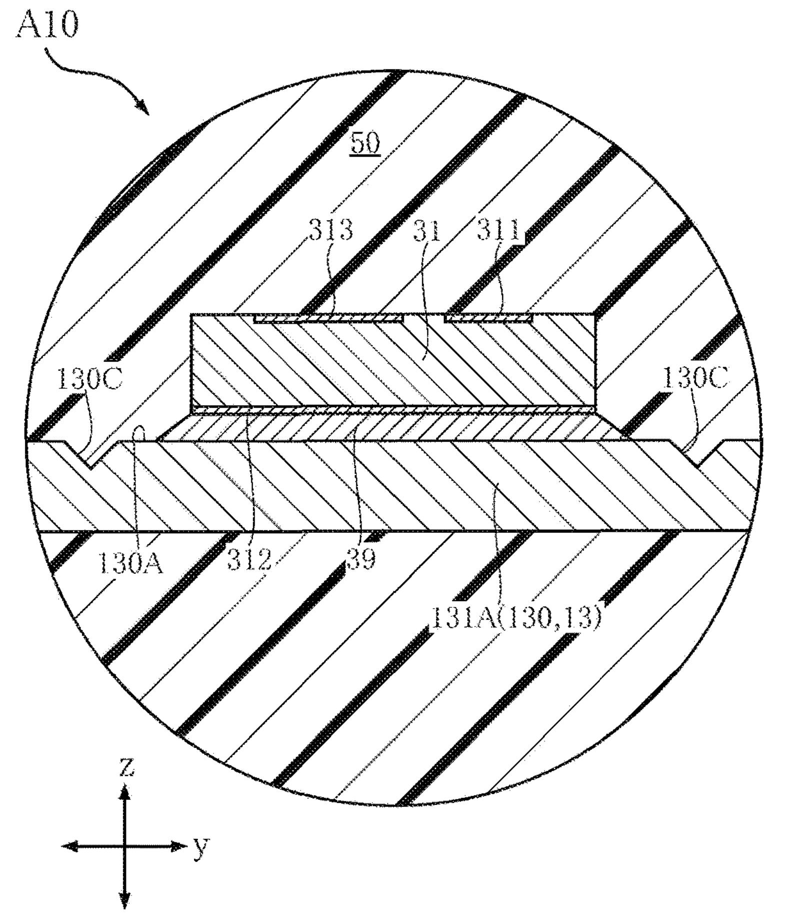
FIG. 14 is a partially enlarged cross-sectional view taken along line XIV-XIV in FIG. 3.

As shown in FIG. 3, the first switching elements 31 are individually bonded to the first mounting portions 130. As shown in FIGS. 9, 10, and 14, each of the first mounting portions 130 has an obverse surface 130A facing in the thickness direction z. The obverse surface 130A may be covered with a silver plating layer, for example. The first mounting portions 130 include a first region 131A, a second region 131B, and a third region 131C.

As shown in FIG. 3, the first region 131A is located next to the second suspending portion 124 of the second lead 12 in the first direction x. The first region 131A is also located next to the second band-shaped portion 121B of the second lead 12 in the second direction y. As shown in FIGS. 3 and 10, the first region 131A is formed with a pair of holes 130B penetrating through in the thickness direction z. In the second direction y, the pair of holes 130B flank the first switching element 31 bonded to the first region 131A. As shown in FIGS. 3 and 14, the first region 131A is formed with a plurality of grooves 130C recessed from the obverse surface 130A. The grooves 130C are positioned around the first switching element 31 bonded to the first region 131A. The grooves 130C are formed by V-notching, for example.

As shown in FIG. 3, the second region 131B is located next to the first band-shaped portion 121A in the first direction x. The second region 131B is formed with grooves 130C. The grooves 130C are positioned in the first sense of the first direction x relative to the first switching element 31 bonded to the second region 131B.

As shown in FIG. 3, the third region 131C is located next to the second connecting portion 123 of the second lead 12 in the first direction x. The third region 131C is also located next to the third band-shaped portion 121C of the second lead 12 in the second direction y. The third region 131C is formed with grooves 130C. The grooves 130C are positioned in the second sense of the first direction x relative to the first switching element 31 bonded to the third region 131C.

As shown in FIGS. 2 and 3, the third terminal portion 132 protrudes from the sealing resin 50 in the first sense of the first direction x as viewed in the thickness direction z. As with fourth terminal portions 142 of the fourth leads 14 shown in FIG. 6 (details are described below), the third terminal portion 132 is bent into a hook shape as viewed in the second direction y. The third terminal portion 132 is covered with a tin plating layer or a tin-silver alloy plating layer, for example.

As shown in FIG. 3, the third connecting portion 133 connects the first mounting portions 130 and the third terminal portion 132 to each other. The third connecting portion 133 has an outer connecting portion 133A, a first inner connecting portion 133B, and a second inner connecting portion 133C.

As shown in FIG. 3, the outer connecting portion 133A connects the first region 131A and the third terminal portion 132 to each other. The outer connecting portion 133A extends in the first direction x.

As shown in FIG. 3, the first inner connecting portion 133B connects the first region 131A and the second region 131B. An end portion of the first inner connecting portion 133B is connected to the second region 131B, and is formed with a groove 133D. The groove 133D is recessed from the surface of the third connecting portion 133 that faces in the same direction as the obverse surfaces 130A of the first mounting portions 130. The groove 133D is formed in the same manner as the grooves 130C.

As shown in FIG. 3, the second inner connecting portion 133C connects the second region 131B and the third region 131C. An end portion of the second inner connecting portion 133C is connected to the third region 131C, and is formed with a groove 133D. The other end of the second inner connecting portion 133C is connected to the second region 131B, and is formed with a groove 133D.

As shown in FIG. 3, a part of the second region 131B protrudes from the first inner connecting portion 133B and the second inner connecting portion 133C in the first sense of the first direction x.

As shown in FIG. 3, the third suspending portion 134 extends from the third region 131C in the second direction y.

The third suspending portion 134 has an end surface 134A facing in the second direction y and exposed from the sealing resin 50. The end surface 134A has a pair of regions spaced apart from each other in the first direction x. An end portion of the third suspending portion 134 is connected to the third region 131C, and is formed with a plurality of grooves 134B. The grooves 134B are recessed from the surface of the third suspending portion 134 facing in the same direction as the obverse surfaces 130A of the first mounting portions 130. The grooves 134B are formed in the same manner as the grooves 130C.

As shown in FIG. 3, the third auxiliary suspending portion 135 extends from the outer connecting portion 133A in the second direction y. The third auxiliary suspending portion 135 has an end surface 135A facing in the second direction y and exposed from the sealing resin 50.

Figure 11:
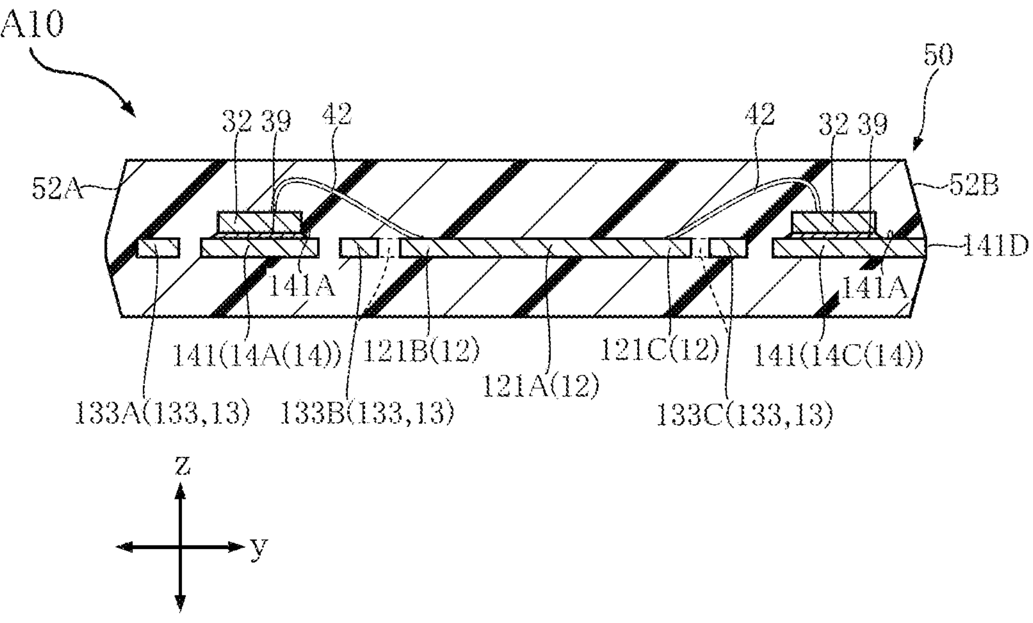
FIG. 11 is a cross-sectional view taken along line XI-XI in FIG. 3.

As shown in FIG. 11, the first band-shaped portion 121A overlaps with the second region 131B, the first inner connecting portion 133B, and the second inner connecting portion 133C as viewed in the first direction x. As shown in FIG. 3, a part of each of the second band-shaped portion 121B and the third band-shaped portion 121C are positioned between the first inner connecting portion 133B and the second inner connecting portion 133C.

As shown in FIG. 3, the fourth leads 14 are spaced apart from the second lead 12 with the third lead 13 interposed therebetween. Each of the fourth leads 14 has a second mounting portion 141 and a fourth terminal portion 142.

As shown in FIG. 3, the second switching elements 32 are individually bonded to the second mounting portions 141 of the fourth leads 14. Each of the second mounting portions 141 has an obverse surface 141A facing in the same direction as the obverse surfaces 130A of the first mounting portions 130. The obverse surface 141A may be covered with a silver plating layer, for example.

Figure 6:
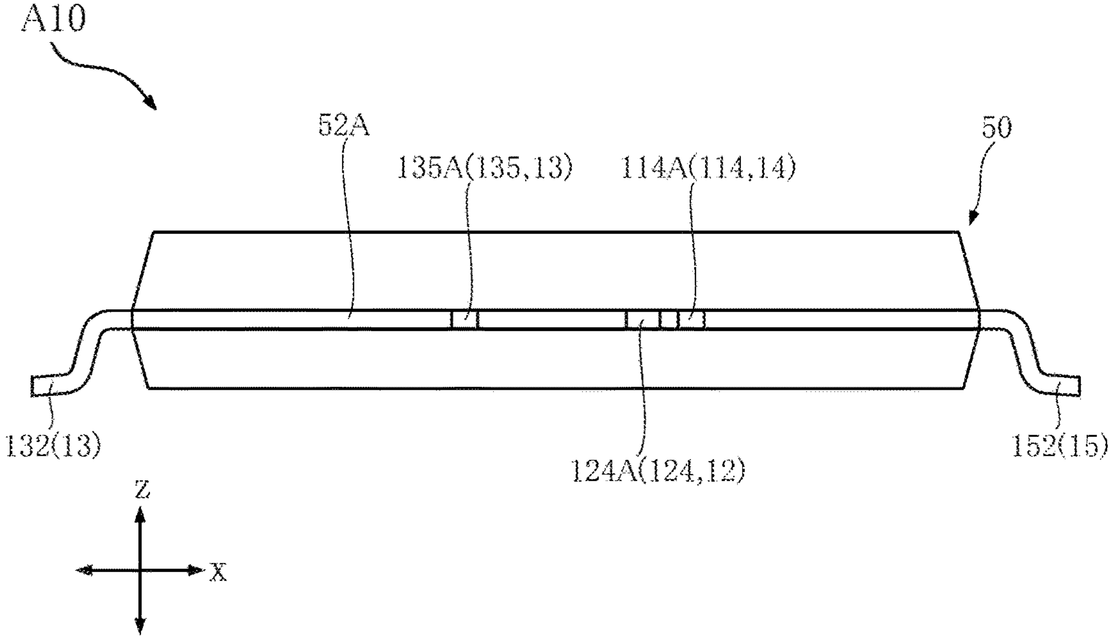
FIG. 6 is a rear view illustrating the semiconductor device in FIG. 1.

As shown in FIGS. 2 and 3, the fourth terminal portions 142 protrude from the sealing resin 50 in the first sense of the first direction x as viewed in the thickness direction z. The fourth terminal portions 142 are connected to the second mounting portions 141. The fourth terminal portions 142 are aligned in the second direction y, together with the third terminal portion 132. As shown in FIG. 6, each of the fourth terminal portions 142 is bent into a hook shape as viewed in the second direction y. Each of the fourth terminal portions 142 is covered with a tin plating layer or a tin-silver alloy plating layer, for example.

As shown in FIG. 3, the fourth leads 14 include a U-phase lead 14A, V-phase lead 14B, and W-phase lead 14C. The following describes the second mounting portion 141 of each of the U-phase lead 14A, the V-phase lead 14B, and the W-phase lead 14C.

Figure 12:
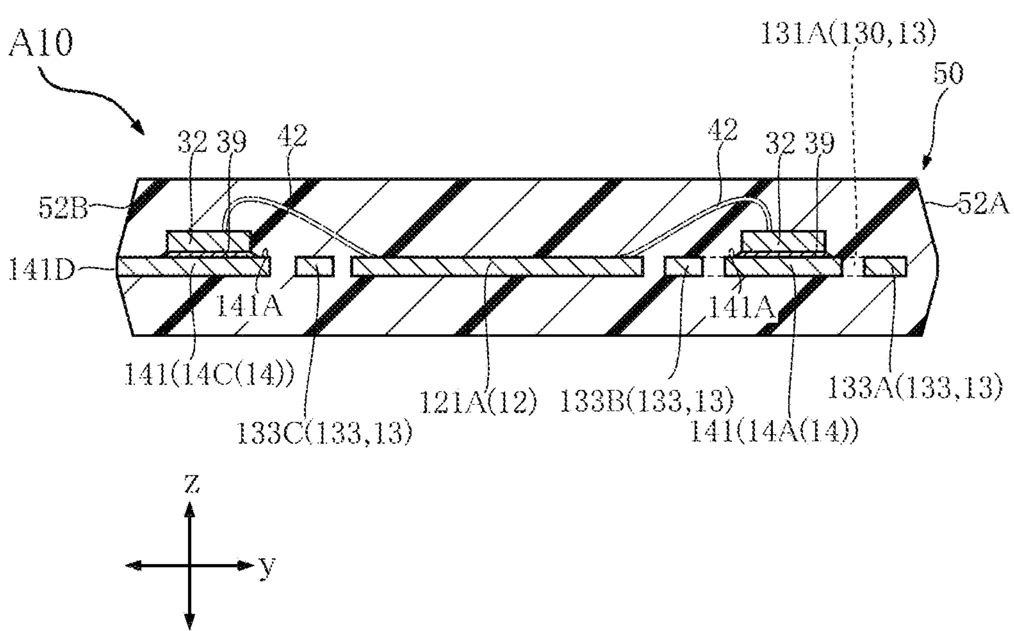
FIG. 12 is a cross-sectional view taken along line XII-XII in FIG. 3.
Figure 13:
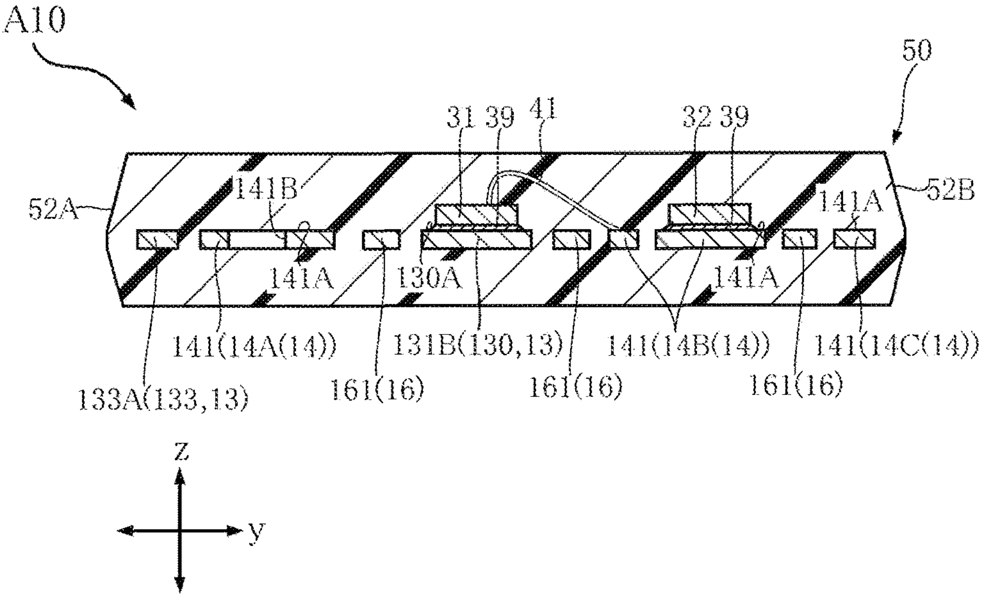
FIG. 13 is a cross-sectional view taken along line XIII-XIII in FIG. 3.
Figure 15:
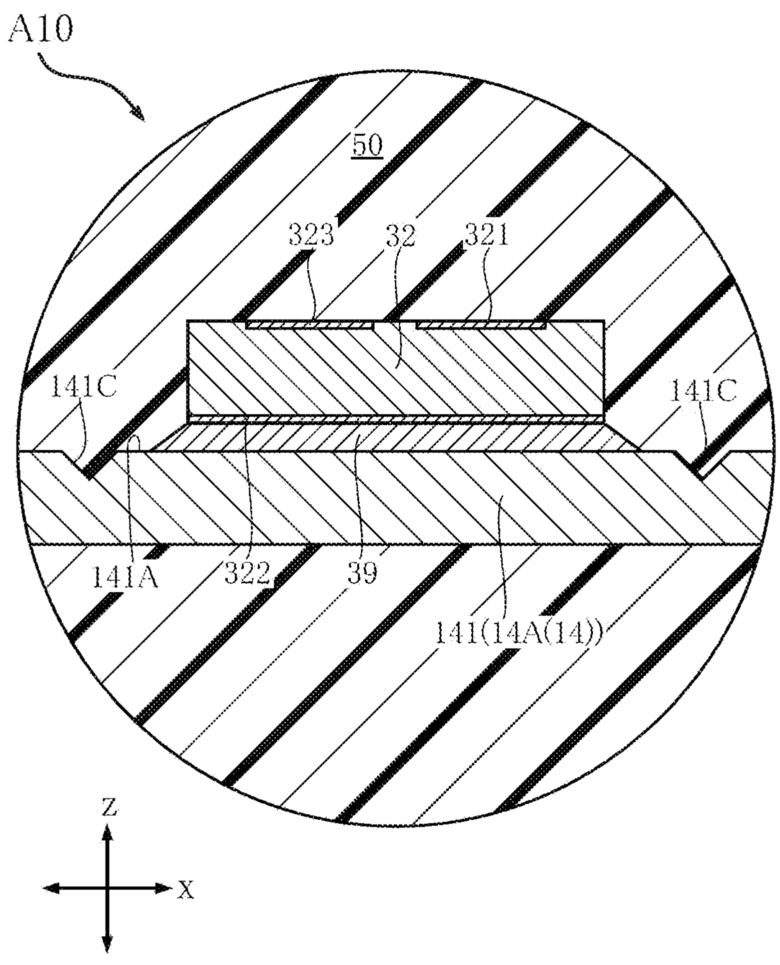
FIG. 15 is a partially enlarged cross-sectional view taken along line XV-XV in FIG. 3.

As shown in FIG. 12, a part of the second mounting portion 141 of the U-phase lead 14A overlaps with the first region 131A as viewed in the first direction x. Furthermore, a part of the second mounting portion 141 of the U-phase lead 14A is located between the outer connecting portion 133A and the first inner connecting portion 133B. As shown in FIGS. 3 and 13, the second mounting portion 141 of the U-phase lead 14A is formed with a hole 141B penetrating through in the thickness direction z. The hole 141B is positioned in the first sense of the first direction x relative to the second switching element 32 bonded to the second mounting portion 141 of the U-phase lead 14A. As shown in FIGS. 3 and 15, the second mounting portion 141 of the U-phase lead 14A is formed with a plurality of grooves 141C recessed from the obverse surface 141A. The grooves 141C are positioned around the second switching element 32 bonded to the second mounting portion 141 of the U-phase lead 14A. The grooves 141C are formed in the same manner as the grooves 130C.

As shown in FIG. 3, the second mounting portion 141 of the V-phase lead 14B is located next to the second inner connecting portion 133C in the first direction x. The second mounting portion 141 of the V-phase lead 14B is formed with a plurality of grooves 141C. The grooves 141C are positioned around the second switching element 32 bonded to the second mounting portion 141 of the V-phase lead 14B.

As shown in FIG. 3, the second mounting portion 141 of the W-phase lead 14C is located next to the third region 131C and the third suspending portion 134 in the first direction x. The second mounting portion 141 of the W-phase lead 14C is also located next to the second inner connecting portion 133C in the second direction y. The second mounting portion 141 of the W-phase lead 14C is formed with a plurality of grooves 141C. The grooves 141C are positioned around the second switching element 32 bonded to the second mounting portion 141 of the W-phase lead 14C.

As shown in FIG. 3, the fifth leads 15 are spaced apart from the second lead 12 with the first lead 11 interposed therebetween. Each of the fifth leads 15 has a covered portion 151 and a fifth terminal portion 152.

Figure 16:
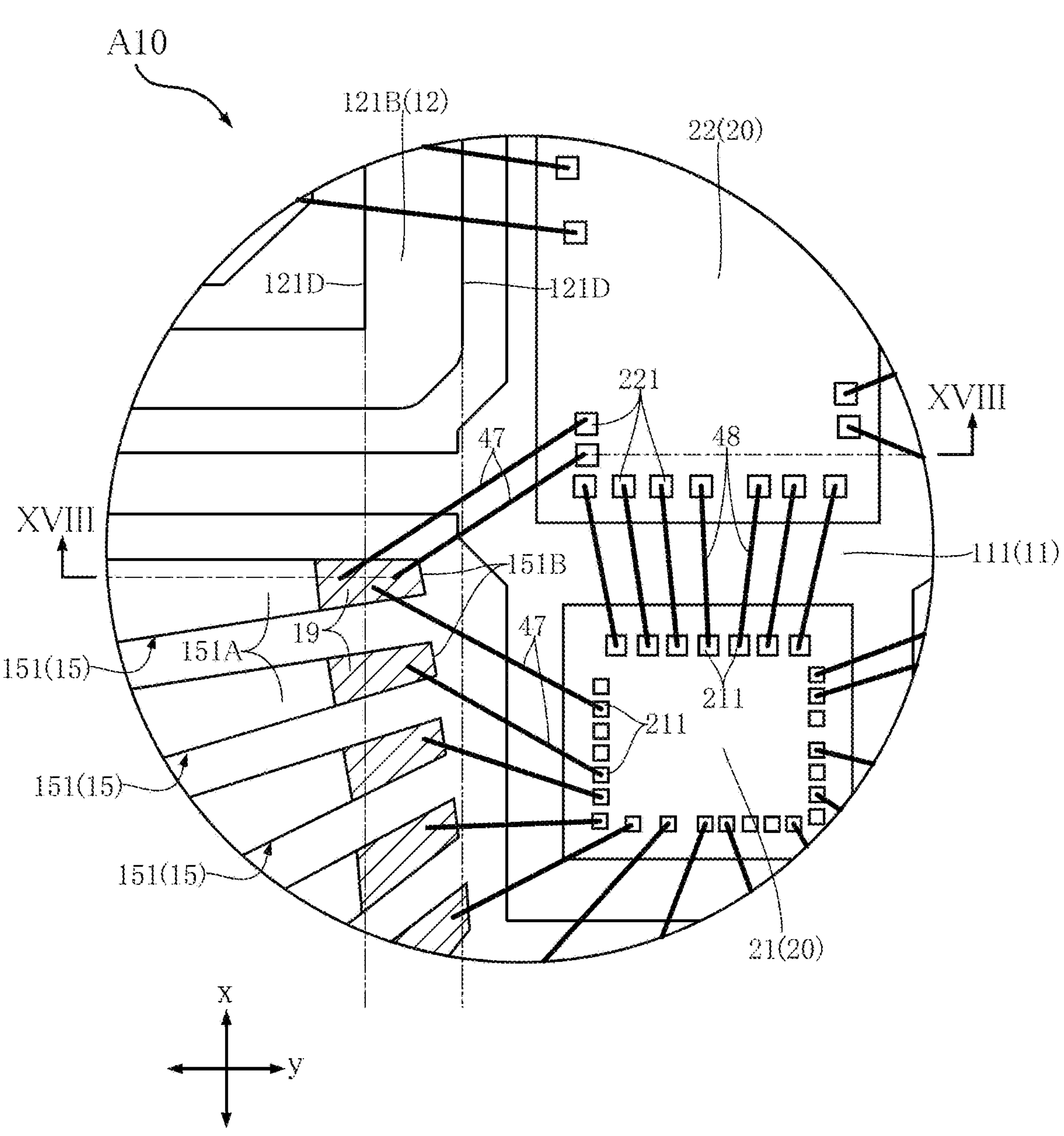
FIG. 16 is a partially enlarged view of FIG. 3.
Figure 18:
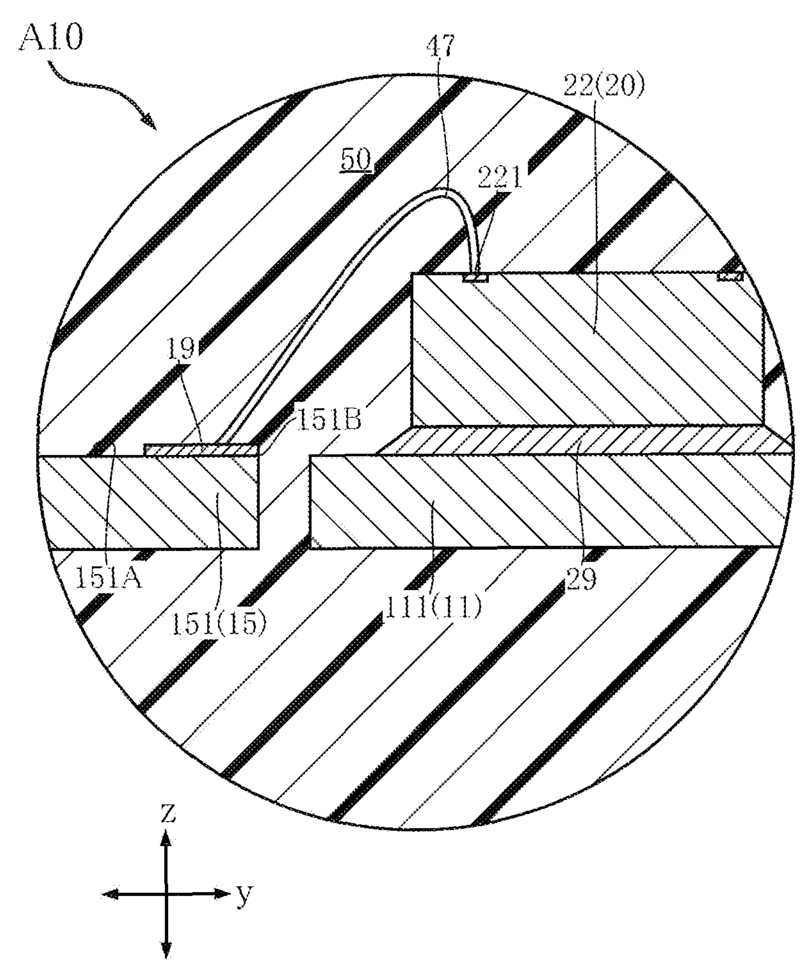
FIG. 18 is a cross-sectional view taken along line XVIII-XVIII in FIG. 16.

As shown in FIG. 3, the island portion 111 of the first lead 11 includes a region protruding from the first connecting portion 113 and the first suspending portion 114 toward the fifth leads 15 in the first direction x. The covered portions 151 of the fifth leads 15 are arranged to surround the region. The covered portions 151 are covered with the sealing resin 50. As shown in FIGS. 16 to 18, each of the covered portions 151 has an obverse surface 151A and an edge 151B. The obverse surface 151A faces in the same direction as the obverse surfaces 130A of the first mounting portions 130 in the thickness direction z. The edge 151B is a part of the periphery of the covered portion 151 closest to the periphery of the island portion 111, as viewed in the thickness direction z. The edge 151B is included in the obverse surface 151A.

As shown in FIG. 16, the second band-shaped portion 121B of the second lead 12 has a pair of first edges 121D as viewed in the thickness direction z. The pair of first edges 121D extend in the first direction x and are spaced apart from each other in the second direction y. As viewed in the thickness direction z, the edge 151B of the covered portion 151 of the fifth lead 15 closest to the second band-shaped portion 121B is positioned between the pair of first edges 121D in the second direction y. The fifth lead 15 is located next to the first suspending portion 114 of the first lead 11.

As shown in FIG. 17, the third band-shaped portion 121C of the second lead 12 has a pair of second edges 121E as viewed in the thickness direction z. The pair of second edges 121E extend in the first direction x and are spaced apart from each other in the second direction y. As viewed in the thickness direction z, the edge 151B of the covered portion 151 of the fifth lead 15 closest to the third band-shaped portion 121C is positioned between the pair of second edges 121E in the second direction y. The fifth lead 15 is located next to the first connecting portion 113 of the first lead 11.

As shown in FIGS. 16 to 18, the semiconductor device A10 further includes a plurality of metal layers 19 located between the obverse surfaces 151A of the covered portions 151 of the fifth leads 15 and the wires 47. The metal layer 19 is a silver plating layer, for example. As shown in FIG. 16, as viewed in the thickness direction z, at least a part of the metal layer 19 on the obverse surface 151A of the covered portion 151 of the fifth lead 15 closest to the second band-shaped portion 121B of the second lead 12 is positioned between the pair of first edges 121D of the second band-shaped portion 121B in the second direction y. As shown in FIG. 17, as viewed in the thickness direction z, at least a part of the metal layer 19 on the obverse surface 151A of the covered portion 151 of the fifth lead 15 closest to the third band-shaped portion 121C is positioned between the pair of second edges 121E of the third band-shaped portion 121C in the second direction y. The metal layers 19 act to reduce an impact transmitted to the fifth leads 15 when the wires 47 are bonded to the covered portions 151 of the fifth leads 15.

As shown in FIG. 3, in the semiconductor device A10, each of the first lead 11, the second lead 12, the fourth leads 14, and the sixth leads 16 has an area to which one of the first wires 41, the second wires 42, the boot wires 45, and the ground wires 46 is bonded, and the area is covered with a metal layer 19. In FIG. 3, the areas provided with the metal layers 19 are indicated by oblique lines.

As shown in FIGS. 2 and 3, the fifth terminal portions 152 protrude from the sealing resin 50 in the first direction x as viewed in the thickness direction z. The fifth terminal portions 152 are connected to the covered portions 151. The fifth terminal portions 152 are aligned in the second direction y, together with the first terminal portion 112 of the first lead 11 and the second terminal portion 122 of the second lead 12. As with the second terminal portion 122 shown in FIG. 5, each of the fifth terminal portions 152 is bent into a hook shape as viewed in the second direction y. Each of the fifth terminal portions 152 is covered with a tin plating layer or a tin-silver alloy plating layer, for example.

As shown FIG. 3, the sixth leads 16 are located in the first sense of the first direction x relative to the third lead 13. Each of the sixth leads 16 is located next to a different one of the fourth leads 14 in the second direction y. In this way, the sixth leads 16 are arranged in correspondence with the fourth leads 14. Each of the sixth leads 16 has a covered portion 161 and a sixth terminal portion 162.

As shown in FIG. 3, the covered portions 161 are located next to the respective second mounting portions 141 in the second direction y. The covered portions 161 are covered with the sealing resin 50.

As shown in FIGS. 2 and 3, the sixth terminal portions 162 protrude from the sealing resin 50 in the first direction x as viewed in the thickness direction z. The sixth terminal portions 162 are connected to the covered portions 161. The sixth terminal portions 162 of the sixth leads 16 are aligned in the second direction y, together with the third terminal portion 132 and the fourth terminal portions 142 of the fourth leads 14. As with the fourth terminal portion 142 shown in FIG. 5, each of the sixth terminal portions 162 is bent into a hook shape as viewed in the second direction y. Each of the sixth terminal portions 162 is covered with a tin plating layer or a tin-silver alloy plating layer, for example.

As shown in FIGS. 3, 9, and 10, the IC 20 is mounted on the island portion 111 of the first lead 11. In the semiconductor device A10, the IC 20 includes a first IC 21 and a second IC 22. The first IC 21 and the second IC 22 are electrically connected to each other. In the first direction x, the second IC 22 is located between the first IC 21 and the first band-shaped portion 121A of the second lead 12. The first IC 21 controls the second IC 22. The second IC 22 outputs a gate voltage for driving the first switching elements 31 and the second switching elements 32. The first IC 21 has a plurality of first electrodes 211. The first electrodes 211 are electrically connected to the second IC 22, the fifth leads 15, and the first lead 11, in addition to the circuit configured in the first IC 21. The second IC 22 has a plurality of second electrodes 221. The second electrodes 221 are electrically connected to the first IC 21, the first switching elements 31, the second switching elements 32, the sixth leads 16, the first lead 11, the second lead 12, and the fifth leads 15, in addition to the circuit configured in the second IC 22.

As shown in FIGS. 9 and 10, the semiconductor device A10 further includes a bonding layer 29. The bonding layer 29 is located between the island portion 111 and each of the first IC 21 and the second IC 22. The bonding layer 29 is a silver paste mainly containing epoxy resin, for example. Alternatively, the bonding layer 29 may be a sintered metal containing silver, or may be solder. The first IC 21 and the second IC 22 are bonded to the island portion 111 via the bonding layer 29.

As shown in FIGS. 3, 9, and 10, the first switching elements 31 are individually bonded to the obverse surfaces 130A of the first mounting portions 130 (third lead 13). As a result, the semiconductor device A10 is configured such that the first switching elements 31 are individually bonded to the first region 131A, the second region 131B, and the third region 131C. The first switching elements 31 are individually and electrically connected to the second mounting portions 141 (fourth leads 14). Each of the first switching elements 31 is a metal-oxide-semiconductor field-effect transistor (MOSFET) mainly made of silicon (Si) or silicon carbide (SiC). Note that the first switching elements 31 may be transistors other than MOSFETs. In the semiconductor device A10, each of the first switching elements 31 is assumed to be an n-channel MOSFET having a vertical structure. As shown in FIG. 14, each of the first switching elements 31 has a first obverse-surface electrode 311, a first reverse-surface electrode 312, and a first gate electrode 313.

As shown in FIGS. 3 and 14, the first obverse-surface electrode 311 is provided in the sense of the thickness direction z in which the obverse surface 130A of the first mounting portion 130 faces. The current that flows through the first obverse-surface electrode 311 corresponds to the electric power that has been converted by the first switching element 31. Accordingly, the first obverse-surface electrode 311 corresponds to the source electrode of the first switching element 31.

As shown in FIG. 14, the first reverse-surface electrode 312 is arranged opposite from the first obverse-surface electrode 311 in the thickness direction z. The current that flows through the first reverse-surface electrode 312 corresponds to the electric power that has yet to be converted by the first switching element 31. Accordingly, the first reverse-surface electrode 312 corresponds to the drain electrode of the first switching element 31.

As shown in FIGS. 3 and 14, the first gate electrode 313 is provided on a first element obverse surface 31A. The first gate electrode 313 is the gate electrode of the first switching element 31. Accordingly, a gate voltage for driving the first switching element 31 is applied to the first gate electrode 313. As viewed in the thickness direction z, the area of the first gate electrode 313 is smaller than the area of the first obverse-surface electrode 311 (see FIG. 3).

As shown in FIGS. 3, 11, and 13, the second switching elements 32 are individually bonded to the obverse surfaces 141A of the second mounting portions 141 (fourth leads 14). As a result, the semiconductor device A10 is configured such that the second switching elements 32 are individually bonded to the U-phase lead 14A, the V-phase lead 14B, and the W-phase lead 14C. The second switching elements 32 are electrically connected to the second lead 12. The second switching elements 32 are the semiconductor elements identical to the first switching elements 31. As shown in FIG. 15, each of the second switching elements 32 has a second obverse-surface electrode 321, a second reverse-surface electrode 322, and a second gate electrode 323.

As shown in FIGS. 3 and 15, the second obverse-surface electrode 321 is provided in the sense of the thickness direction z in which the obverse surface 141A of the second mounting portion 141 faces. The current that flows through the second obverse-surface electrode 321 corresponds to the electric power that has been converted by the second switching element 32. Accordingly, the second obverse-surface electrode 321 corresponds to the source electrode of the second switching element 32.

As shown in FIG. 15, the second reverse-surface electrode 322 is arranged opposite from the second obverse-surface electrode 321 in the thickness direction z. The current that flows through the second reverse-surface electrode 322 corresponds to the electric power that has yet to be converted by the second switching element 32. Accordingly, the second reverse-surface electrode 322 corresponds to the drain electrode of the second switching element 32.

As shown in FIGS. 3 and 15, each of the second gate electrodes 323 is provided on a second element obverse surface 32A. The second gate electrode 323 is the gate electrode of the second switching element 32. Accordingly, a gate voltage for driving the second switching element 32 is applied to the second gate electrode 323. As viewed in the thickness direction z, the area of the second gate electrode 323 is smaller than the area of the second obverse-surface electrode 321 (see FIG. 3).

As shown in FIGS. 9 to 15, the semiconductor device A10 further includes a conductive bonding layer 39. The conductive bonding layer 39 is located between the obverse surface 130A of each of the first mounting portions 130 (third lead 13) and the first reverse-surface electrode 312 of each of the first switching elements 31. Furthermore, the bonding layer 29 is located between the obverse surface 141A of the second mounting portion 141 of each of the fourth leads 14 and the second reverse-surface electrode 322 of each of the second switching elements 32. The first reverse-surface electrodes 312 of the first switching elements 31 are individually bonded to the obverse surfaces 130A of the first mounting portions 130 via the conductive bonding layer 39. As a result, the first switching elements 31 are electrically connected to the third lead 13. The second reverse-surface electrodes 322 of the second switching elements 32 are individually bonded to the obverse surfaces 141A of the second mounting portions 141 of the fourth leads 14 via the conductive bonding layer 39. As a result, the second switching elements 32 are individually and electrically bonded to the fourth leads 14. The conductive bonding layer 39 is solder mainly containing a tin alloy, for example.

As shown in FIG. 3, the first wires 41 are individually bonded to the first obverse-surface electrodes 311 of the first switching elements 31, and to the second mounting portions 141. As a result, the fourth leads 14 are individually and electrically connected to the first switching elements 31. The material of the first wires 41 is one selected from among gold (Au), copper, silver, and aluminum (Al).

As shown in FIG. 3, the second wires 42 are individually bonded to the second obverse-surface electrodes 321 of the second switching elements 32, and to the second band-shaped portion 121B and the third band-shaped portion 121C of the second lead 12. As a result, the second switching elements 32 are electrically connected to the second lead 12. The material of the second wires 42 is one selected from among gold, copper, silver, and aluminum.

As shown in FIG. 3, each of the first gate wires 431, the second gate wires 432, the first potential wires 441, the second potential wire 442, the boot wires 45, the ground wires 46, the wires 47 and the relay wires 48 is bonded to either a first electrode 211 of the first IC 21 or a second electrode 221 of the second IC 22. The material of these wires is one selected from among gold, copper, silver, and aluminum.

The following description is provided with an assumption that the first wires 41, the second wires 42, the first gate wires 431, the second gate wires 432, the first potential wires 441, the second potential wire 442, the boot wires 45, the ground wires 46, the wires 47, and the relay wires 48 are all made of aluminum. In this example, the diameter of each of the first wires 41 and the second wires 42 is larger than the diameter of each of the first gate wires 431, the second gate wires 432, the first potential wires 441, the second potential wire 442, the boot wires 45, the ground wires 46, the wires 47, and the relay wires 48. This is because, in the semiconductor device A10, the current flowing through the first wires 41 and the second wires 42 is larger than the current flowing through the other wires. In addition, even in the case where the material of the wires in the semiconductor device A10 is one of gold, copper, and silver, the diameter of each of the first wires 41 and the second wires 42 may be larger than the diameter of each of the other wires.

In the semiconductor device A10, the first wires 41, the second wires 42, the second potential wire 442, the boot wires the ground wires 46, the wires 47, and the relay wires 48 may be made of copper, and the first gate wires 431, the second gate wires 432, and the first potential wires 441 may be made of gold. In this way, the wires of the semiconductor device A10 may be made of one or more types of materials.

As shown in FIG. 3, each of the first gate wires 431 is bonded to a second electrode 221 of the second IC 22, and to the first gate electrode 313 of a first switching element 31. The first gate wires 431 electrically connect the first gate electrodes 313 to a driver circuit 236 of the second IC 22 (see FIG. 19). The gate voltage outputted from the driver circuit 236 is applied to each of the first gate electrodes 313 via the first gate wires 431.

As shown in FIG. 3, each of the second gate wires 432 is bonded to a second electrode 221 of the second IC 22, and to the second gate electrode 323 of a second switching element 32. The second gate wires 432 electrically connect the second gate electrodes 323 to the driver circuit 236 of the second IC 22 (see FIG. 19). The gate voltage outputted from the driver circuit 236 is applied to each of the second gate electrodes 323 via the second gate wires 432.

As shown in FIG. 3, each of the first potential wires 441 is bonded to a second electrode 221 of the second IC 22, and to the first obverse-surface electrode 311 of a first switching element 31. The first potential wires 441 electrically connect the first obverse-surface electrodes 311 to the driver circuit 236 of the second IC 22 (see FIG. 19). Since the first obverse-surface electrodes 311 are individually and electrically connected to the fourth leads 14, the negative potential of the gate power supply that generates the gate voltage for driving the first switching elements 31 is different for each first switching element 31. The gate voltage is required to be higher than the gate voltage for driving the second switching elements 32. Thus, the gate power supply that generates the gate voltage is configured with a plurality of capacitors C electrically connected to the semiconductor device A10 shown in FIG. 19. The capacitors C individually correspond to the first switching elements 31. The first potential wires 441 transfer the negative potentials of the respective capacitors C to the driver circuit 236 of the second IC 22.

As shown in FIG. 3, the second potential wire 442 is bonded to a second electrode 221 of the second IC 22 and the second lead 12. The second obverse-surface electrodes 321 of the second switching elements 32 are electrically connected to an overcurrent protector 233 of the second IC 22, via the second wires 42, the second lead 12, and the second potential wire 442 (see FIG. 19). This means that the negative potentials of the gate power supply that generates the gate voltage for driving the second switching elements 32 are all common to each other. The gate power supply is equivalent to the power supply for driving the second IC 22.

As shown in FIG. 3, each of the boot wires 45 is bonded to a second electrode 221 of the second IC 22, and to the covered portion 161 of a sixth lead 16. The sixth leads 16 are electrically connected to the driver circuit 236 of the second IC 22 via the boot wires 45 (see FIG. 19).

As shown in FIG. 3, each of the ground wires 46 is bonded to either a first electrode 211 of the first IC 21 or a second electrode 221 of the second IC 22, and to the first connecting portion 113 of the first lead 11. As a result, the first lead 11 is electrically bonded to the first IC 21 and the second IC 22 via the ground wires 46. In the semiconductor device A10, one of the ground wires 46 is bonded to a second electrode 221, and to the base 113A of the first connecting portion 113. This electrically connects the base 113A to the second IC 22. Each of the remaining ground wires 46 is bonded to a first electrode 211 and the tongue 113B of the first connecting portion 113. This electrically connects the tongue 113B to the first IC 21.

As shown in FIG. 3, each of the wires 47 is bonded to either a first electrode 211 of the first IC 21 or a second electrode 221 of the second IC 22, and to the covered portion 151 of a fifth lead 15. As a result, the fifth leads 15 are electrically connected to the first IC 21 and the second IC 22 via the wires 47.

As shown in FIGS. 16 and 17, each of the relay wires 48 is bonded to a first electrode 211 of the first IC 21 and a second electrode 221 of the second IC 22. As a result, the first IC 21 and the second IC 22 are electrically connected to each other.

As shown in FIG. 3, the sealing resin 50 covers a part of each of the first lead 11, the second lead 12, the third lead 13, the fourth leads 14, the sixth leads 16 and the fifth leads 15. As shown in FIG. 3, the sealing resin 50 also covers the first IC 21, the second IC 22, the first switching elements 31, and the second switching elements 32. The material of the sealing resin 50 is a black epoxy resin, for example. As shown in FIG. 2 and FIGS. 5 to 8, the sealing resin 50 has a pair of first side surfaces 51A and 51B, and a pair of second side surfaces 52A and 52B.

Figure 7:
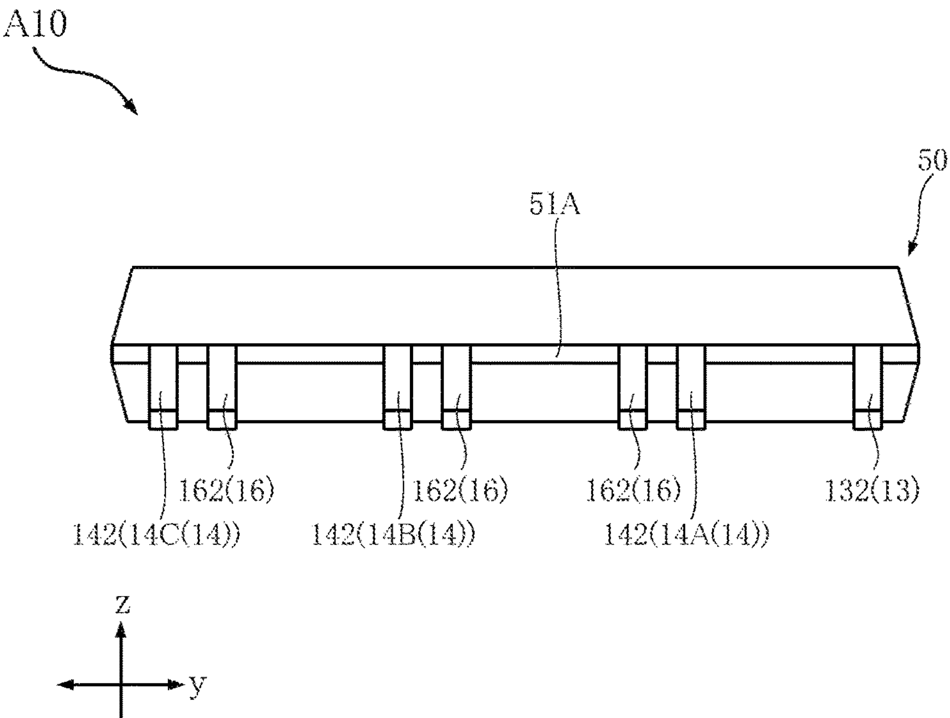
FIG. 7 is a right-side view illustrating the semiconductor device in FIG. 1.
Figure 8:
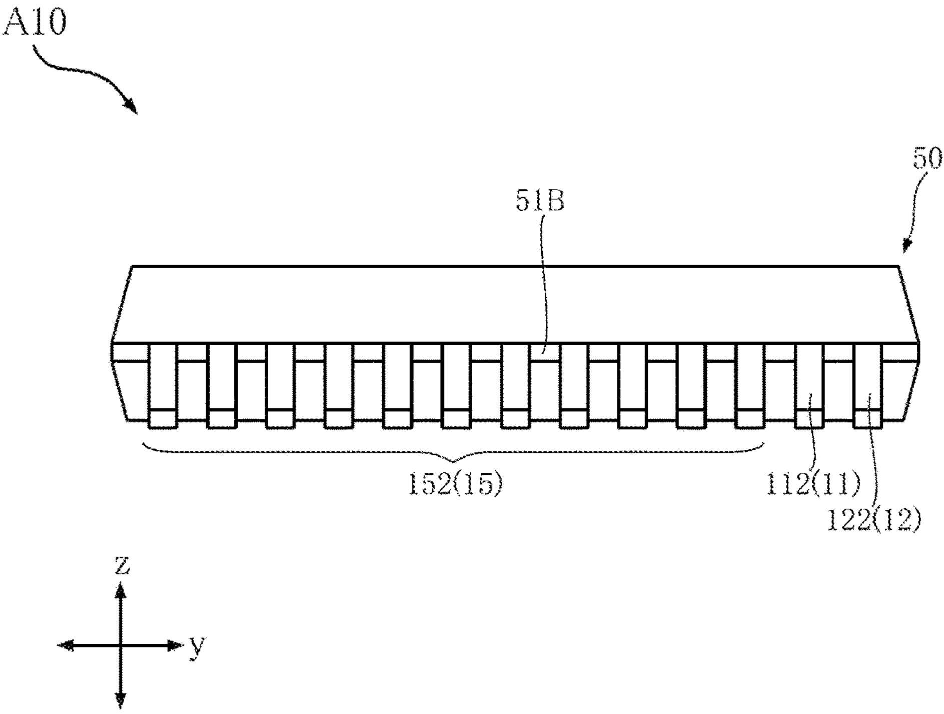
FIG. 8 is a left-side view illustrating the semiconductor device in FIG. 1.

As shown in FIGS. 2, 7, and 8, the pair of first side surfaces 51A and 51B face in the first direction x. The first side surface 51A faces in the first sense of the first direction x. As viewed in the thickness direction z, the third terminal portion 132, the fourth terminal portions 142, and the sixth terminal portions 162 protrude from the first side surface 51A in the first direction x. The first side surface 51B faces in the opposite direction from the first side surface 51A. As viewed in the thickness direction z, the first terminal portion 112, the second terminal portion 122, and the fifth terminal portions 152 protrude from the first side surface 51B in the first direction x.

As shown in FIGS. 2, 5, and 6, the pair of second side surfaces 52A and 52B face in the second direction y. The second side surface 52A faces in the sense of the second direction y in which the first suspending portion 114 is located relative to the island portion 111. As shown in FIG. 6, the end surface 114A of the first suspending portion 114, the end surface 124A of the second suspending portion 124, and the end surface 135A of the third auxiliary suspending portion 135 are exposed from the second side surface 52A. The second side surface 52B faces in the opposite direction from the second side surface 52A. As shown in FIG. 5, the end surface 125A of the second auxiliary suspending portion 125, the end surface 134A of the third suspending portion 134, and an end surface 141D of one of the second mounting portions 141 (W-phase lead 14C) are exposed from the second side surface 52B.

Next, the circuit configuration of the semiconductor device A10 will be described with reference to FIG. 19.

In the following description of the circuit configuration of the semiconductor device A10, the fourth terminal portions 142 will be referred to as a U-phase output terminal 142A, a V-phase output terminal 142B, and a W-phase output terminal 142C. The U-phase output terminal 142A refers to the fourth terminal portion 142 of the U-phase lead 14A. The V-phase output terminal 142B refers to the fourth terminal portion 142 of the V-phase lead 14B. The W-phase output terminal 142C refers to the fourth terminal portion 142 of the W-phase lead 14C. Furthermore, the fifth terminal portions 152 will be referred to as a power supply terminal (VCC terminal) 152A, a VSP terminal 152B, a pair of HU terminals 152C, a pair of HV terminals 152D, a pair of HW terminals 152E, an FGS terminal 152F, a FG terminal 152G, and an RT terminal 152H.

Figure 19:
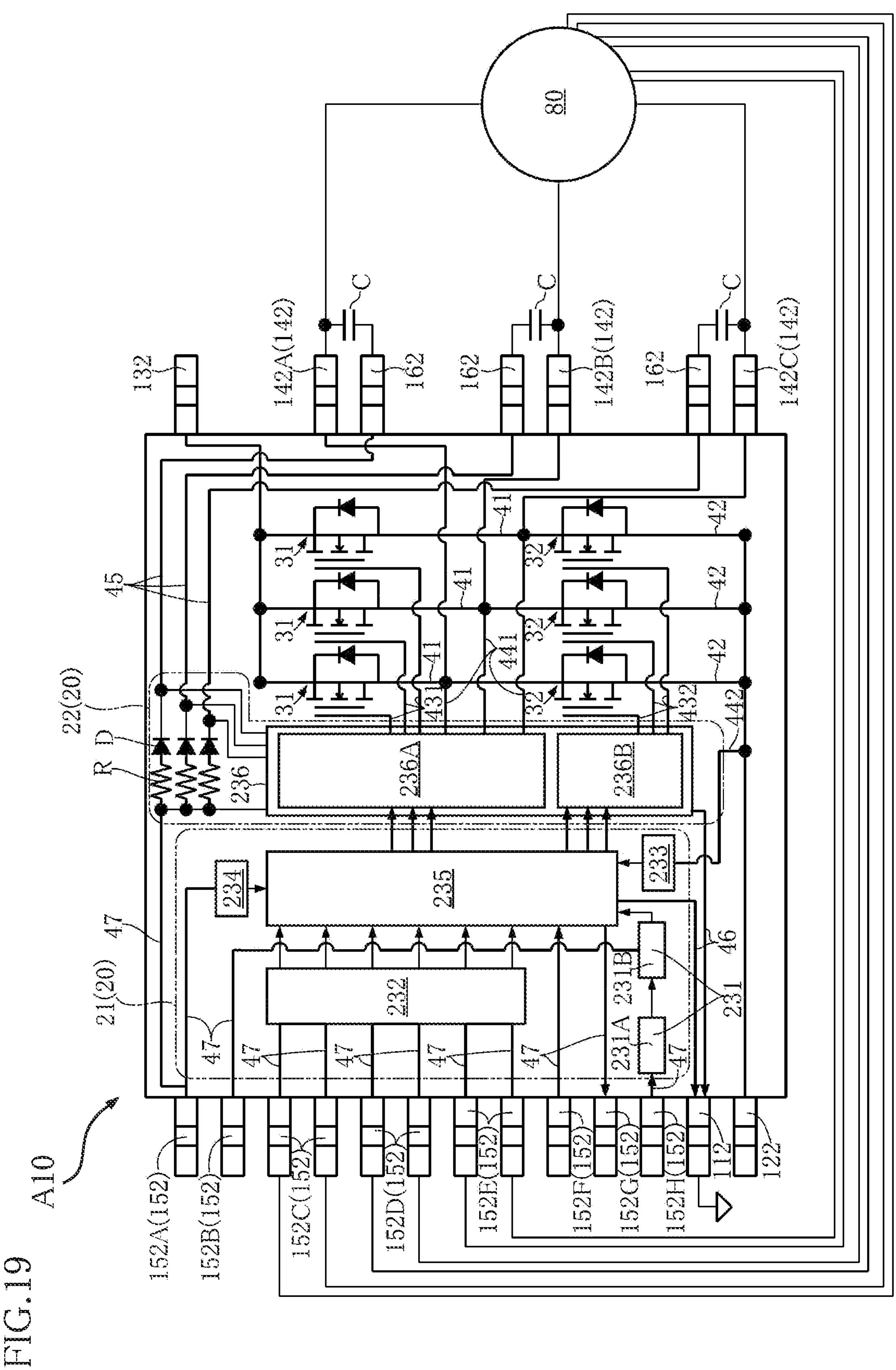
FIG. 19 is a functional block diagram illustrating the semiconductor device in FIG. 1.

As shown in FIG. 19, the semiconductor device A10 is connected to a motor 80, which is subjected to drive control by the semiconductor device A10. The motor 80 is a brushless DC motor. The motor 80 is electrically connected to the U-phase output terminal 142A, the V-phase output terminal 142B, the W-phase output terminal 142C, the pair of HU terminals 152C, the pair of HV terminals 152D, and the pair of HW terminals 152E. The U-phase output terminal 142A, the V-phase output terminal 142B, and the W-phase output terminal 142C are electrically connected to three stators (not illustrated) of the motor 80, respectively. The pair of HU terminals 152C, the pair of HV terminals 152D, and the pair of HW terminals 152E are electrically connected to three Hall elements (not illustrated) arranged within the motor 80, respectively.

As shown in FIG. 19, the first IC 21 includes a first controller circuit 231, a Hall amplifier 232, a voltage drop protector 234, a second controller circuit 235, and an overcurrent protector 233. The first IC 21 may further include a microcontroller control chip.

The first controller circuit 231 generates a pulse width modulation (PWM) signal. The first controller circuit 231 includes a triangular wave generator 231A and a PWM signal converter 231B. The triangular wave generator 231A is electrically connected to the RT terminal 152H via a wire 47. The triangular wave generator 231A generates a triangular wave based on a signal inputted to the RT terminal 152H. The triangular wave serves as a carrier signal (carrier wave) when the driver circuit 236 is controlled by PWM control. The carrier signal is inputted to the PWM signal converter 231B.

The PWM signal converter 231B is electrically connected to the VSP terminal 152B via a wire 47. The VSP terminal 152B inputs a modulation wave signal that is a base for driving the motor 80. The modulation wave signal is a sine wave signal. The PWM signal converter 231B converts the carrier signal inputted from the triangular wave generator 231A and the modulation wave signal inputted from the VSP terminal 152B into a PWM signal, which is a pulse wave, based on the comparison between the carrier signal and the modulation wave signal. The PWM signal is inputted to the second controller circuit 235.

The Hall amplifier 232 is electrically connected to the pair of HU terminals 152C, the pair of HV terminals 152D, and the pair of HW terminals 152E via wires 47. The Hall amplifier 232 amplifies three types of Hall voltages outputted from the Hall elements arranged inside the motor 80. These Hall voltages are signals that each indicate the position of a rotor (not illustrated) of the motor 80 around the axial direction. The three types of Hall voltages amplified by the Hall amplifier 232 are inputted to the second controller circuit 235.

The voltage drop protector 234 is electrically connected to the power supply terminal 152A via a wire 47. Electric power for driving the first IC 21 is inputted to the power supply terminal 152A. The potential at the power supply terminal 152A is the positive potential of the power supply for driving the first IC 21. The voltage drop protector 234 prevents the voltage applied from the power supply terminal 152A to the first IC 21 from dropping below a threshold value.

The second controller circuit 235 distributes or allots the PWM signal inputted from the PWM signal converter 231B to three phases, i.e., a pair of U-phase signals, a pair of V-phase signals, and a pair of W-phase signals, based on the Hall voltages inputted from the Hall amplifier 232. In the semiconductor device A10, each of the pair of U-phase signals, the pair of V-phase signals, and the pair of W-phase signals is a 120-degree-energization rectangular wave signal or a 120-degree-energization sine wave signal. Accordingly, the phase difference of the V-phase signals with respect to the U-phase signals is 120 degrees, and the phase difference of the W-phase signals with respect to the V-phase signals is also 120 degrees. One of the U-phase signals, one of the V-phase signals, and one of the W-phase signals are inputted to a high-side region 236A (details are described below) of the driver circuit 236 of the second IC 22 via relay wires 48. The other U-phase signal, the other V-phase signal, and the other W-phase signal are inputted to a low-side region 236B (details are described below) of the driver circuit 236 via relay wires 48. The pair of U-phase signals, the pair of V-phase signals, and the pair of W-phase signals are adjusted appropriately according to the signals inputted from the overcurrent protector 233.

The second controller circuit 235 is electrically connected to the power supply terminal 152A via the voltage drop protector 234. The second controller circuit 235 is electrically connected to the first terminal portion 112 via ground wires 46. The first terminal portion 112 is the ground terminal of the first IC 21. Accordingly, the potential at the first terminal portion 112 is the negative potential of the power supply for driving the first IC 21. Furthermore, the second controller circuit 235 is electrically connected to the FG terminal 152G and the FGS terminal 152F via a pair of wires 47. The second controller circuit 235 generates a frequency generator (FG) signal indicating the number of revolutions of the motor 80, based on the Hall voltages inputted from the Hall amplifier 232. The FG signal is outputted to the FG terminal 152G. The FGS terminal 152F receives a command signal for setting the number of pulses of the FG signal outputted from the FG terminal 152G.

The overcurrent protector 233 is electrically connected to the second switching elements 32 via the relay wires 48, a wiring layer of the second IC 22, the second potential wire 442, the second lead 12, and the second wires 42. The overcurrent protector 233 detects the current flowing through the second obverse-surface electrode 321 of each of the second switching elements 32. The overcurrent protector 233 generates a signal based on a result of the detection of the current. The generated signal is inputted to the second controller circuit 235.

As shown in FIG. 19, the second IC 22 includes the driver circuit 236. Electric power for driving the second IC 22 is supplied from the power supply terminal 152A, as in the first IC 21. The driver circuit 236 is electrically connected to the power supply terminal 152A.

The driver circuit 236 drives each of the first switching elements 31 and the second switching elements 32, according to the pair of U-phase signals, the pair of V-phase signals, and the pair of W-phase signals inputted from the second controller circuit 235. The driver circuit 236 includes the high-side region 236A and the low-side region 236B.

A plurality of drive circuits are configured in the high-side region 236A. The drive circuits in the high-side region 236A convert one of the U-phase signals, one of the V-phase signals, and one of the W-phase signals inputted from the second controller circuit 235 into a plurality of gate voltages. The gate voltages correspond to the respective positive potentials of the U-phase signals, the V-phase signals, and the W-phase signals. The gate voltages are applied to the first switching elements 31 via the first gate wires 431. As a result, the first switching elements 31 are driven individually.

A plurality of drive circuits are configured in the low-side region 236B. The drive circuits in the low-side region 236B convert the other U-phase signal, the other V-phase signal, and the other W-phase signal inputted from the second controller circuit 235 into a plurality of gate voltages. The gate voltages correspond to the respective negative potentials of the U-phase signals, the V-phase signals, and the W-phase signals. The gate voltages are applied to the second switching elements 32 via the second gate wires 432. As a result, the second switching elements 32 are driven individually.

The driver circuit 236 is electrically connected to the first terminal portion 112 via a ground wire 46. The first terminal portion 112 is also the ground terminal of the second IC 22. Accordingly, the potential at the first terminal portion 112 is the negative potential of the power supply for driving the second IC 22.

In the semiconductor device A10, the DC power for driving the motor 80 is inputted to the third terminal portion 132. The current of the DC power inputted to the third terminal portion 132 flows through the first switching elements 31, the first wires 41, the second switching elements 32, and the second wires 42 in the stated order, and is outputted from the second terminal portion 122.

The DC power inputted to the semiconductor device A10 is converted into the AC power of three phases, i.e., U phase, V phase, and W phase, as a result of the first switching elements 31 and the second switching elements 32 being driven. The U-phase AC power is outputted from the U-phase output terminal 142A. The V-phase AC power is outputted from the V-phase output terminal 142B. The W-phase AC power is outputted from the W-phase output terminal 142C. The three-phase AC power outputted from the U-phase output terminal 142A, the V-phase output terminal 142B, and the W-phase output terminal 142C allows for the drive control of the motor 80.

Each of the capacitors C is electrically connected to the fourth terminal portion 142 of one of the fourth leads 14, and to the sixth terminal portion 162 of the sixth lead 16 located next to the fourth terminal portion 142 in the second direction y. Each of the capacitors C is charged with the electric power inputted to the power supply terminal 152A when the second switching element 32 electrically connected to the first switching element 31 corresponding to the capacitor C is on. The conduction path from the power supply terminal 152A to each capacitor C is formed with a wire 47, a resistor R, a diode D, a boot wire 45, and a sixth terminal portion 162. Of these, the resistor R and the diode D are included in the second IC 22. The electric powers charged in the capacitors C are inputted to the respective drive circuits in the high-side region 236A of the driver circuit 236, via the sixth terminal portions 162, the boot wires 45, and a plurality of second voltage drop protectors 222. As such, the voltage applied to each of the sixth terminal portions 162 of the sixth leads 16 is larger than the voltage applied to the power supply terminal 152A. The voltage applied to each of the sixth terminal portions 162 of the sixth leads 16 is 600 V, for example. On the other hand, the voltage applied to the power supply terminal 152A is 40 V at its maximum, for example. Note that the first potential wires 441 are electrically connected to the respective drive circuits in the high-side region 236A.

Next, advantages of the semiconductor device A10 will be described.

The semiconductor device A10 includes the fifth leads 15 spaced apart from the second lead 12 with the first lead 11 therebetween, and the wires 47 bonded to the IC 20 and the fifth leads 15. As viewed in the thickness direction z, the edge 151B of the fifth lead 15 closest to the second band-shaped portion 121B of the second lead 12 is positioned between the pair of first edges 121D of the second band-shaped portion 121B in the second direction y. This enables the edges 151B of the fifth leads 15 to be arranged closer to the periphery of the island portion 111 of the first lead 11, as viewed in the thickness direction z. This arrangement can shorten the total length of the wires 47, thus allowing the cost reduction of the semiconductor device A10. Furthermore, the parasitic resistance on the electric connection between the fifth leads 15 and the IC 20 can be reduced.

The semiconductor device A10 includes the first IC 21, and the second IC 22 spaced apart from and electrically connected to the first IC 21. The first IC 21 includes the first controller circuit 231 and the second controller circuit 235. The second IC 22 includes the driver circuit 236 that drives the first switching elements 31 and the second switching elements 32 based on the signals from the second controller circuit 235. The fifth leads 15 include the power supply terminal 152A electrically connected to the second controller circuit 235 and the driver circuit 236. The semiconductor device A10 further includes the sixth leads 16 electrically connected to the driver circuit 236. The voltage applied to each of the sixth leads 16 is larger than the voltage applied to the power supply terminal 152A. Accordingly, the voltage applied to the driver circuit 236 is higher than the voltage applied to the second controller circuit 235. In this case, since the first controller circuit 231 and the second controller circuit 235 are spaced apart from the driver circuit 236, the first controller circuit 231 and the second controller circuit 235 receive less noise from the driver circuit 236. This allows the first controller circuit 231 and the second controller circuit 235 to generate a wide range of signals including a rectangular wave signal and a sine wave signal. Thus, the semiconductor device A10 can achieve more efficient motor drive control.

The first lead 11 has the first connecting portion 113 connected to the island portion 111 and the first terminal portion 112, and the first suspending portion 114 located opposite from the first connecting portion 113 with respect to the island portion 111 in the second direction y. The first suspending portion 114 extends in the second direction y. In this way, the island portion 111 is supported by the first connecting portion 113 and the first suspending portion 114 from both sides in the second direction y in the manufacture of the semiconductor device A10. This prevents the island portion 111 from tilting when the IC 20 is bonded to the island portion 111.

The first connecting portion 113 of the first lead 11 has the base 113A and the tongue 113B. The tongue 113B protrudes from the base 113A toward the fifth leads 15 in the first direction x. This makes it possible to increase the number of ground wires 46 bonded to the IC 20 and the first lead 11. Furthermore, the base 113A is formed with the pair of holes 113C penetrating through the first connecting portion 113 in the thickness direction z. The pair of holes 113C flank the tongue 113B in the second direction y. In this way, when the sealing resin 50 is formed during the manufacturing process of the semiconductor device A10, the sealing resin 50 melt within the mold passes through the pair of holes 113C so as to prevent tilting of the tongue 113B. Thus, peeling of the ground wires 46 bonded to the tongue 113B can be prevented as the sealing resin 50 is formed.

The second lead 12 has the second connecting portion 123 connected to the third band-shaped portion 121C and the second terminal portion 122, and the second suspending portion 124 connected to the second band-shaped portion 121B and extending in the second direction y. In this way, the second band-shaped portion 121B, the third band-shaped portion 121C, and the first band-shaped portion 121A located therebetween in the second direction y are supported by the second connecting portion 123 and the second suspending portion 124 from both sides in the second direction y in the manufacture of the semiconductor device A10. This prevents the first band-shaped portion 121A, the second band-shaped portion 121B, and the third band-shaped portion 121C from tilting when the second wires 42 are bonded to the first band-shaped portion 121A, the second band-shaped portion 121B, and the third band-shaped portion 121C.

The first connecting portion 113 of the first lead 11 includes a region that is inclined relative to the first direction x and the second direction y. This suppresses an increase of the external dimension of the semiconductor device A10 in the first direction x.

The second terminal portion 122 of the second lead 12 is located next to the first terminal portion 112 of the first lead 11 in the second direction y. This makes it possible to arrange the second connecting portion 123 of the second lead 12 next to the first connecting portion 113 of the first lead 11. Furthermore, the second connecting portion 123 includes a region that is inclined relative to the first direction x and the second direction y. In this way, the distance between the second connecting portion 123 and the first connecting portion 113 can be reduced as much as possible within a range that does not cause any problem in forming the sealing resin 50. This leads to suppression of an increase of the external dimensions of the semiconductor device A10.

Figure 20:
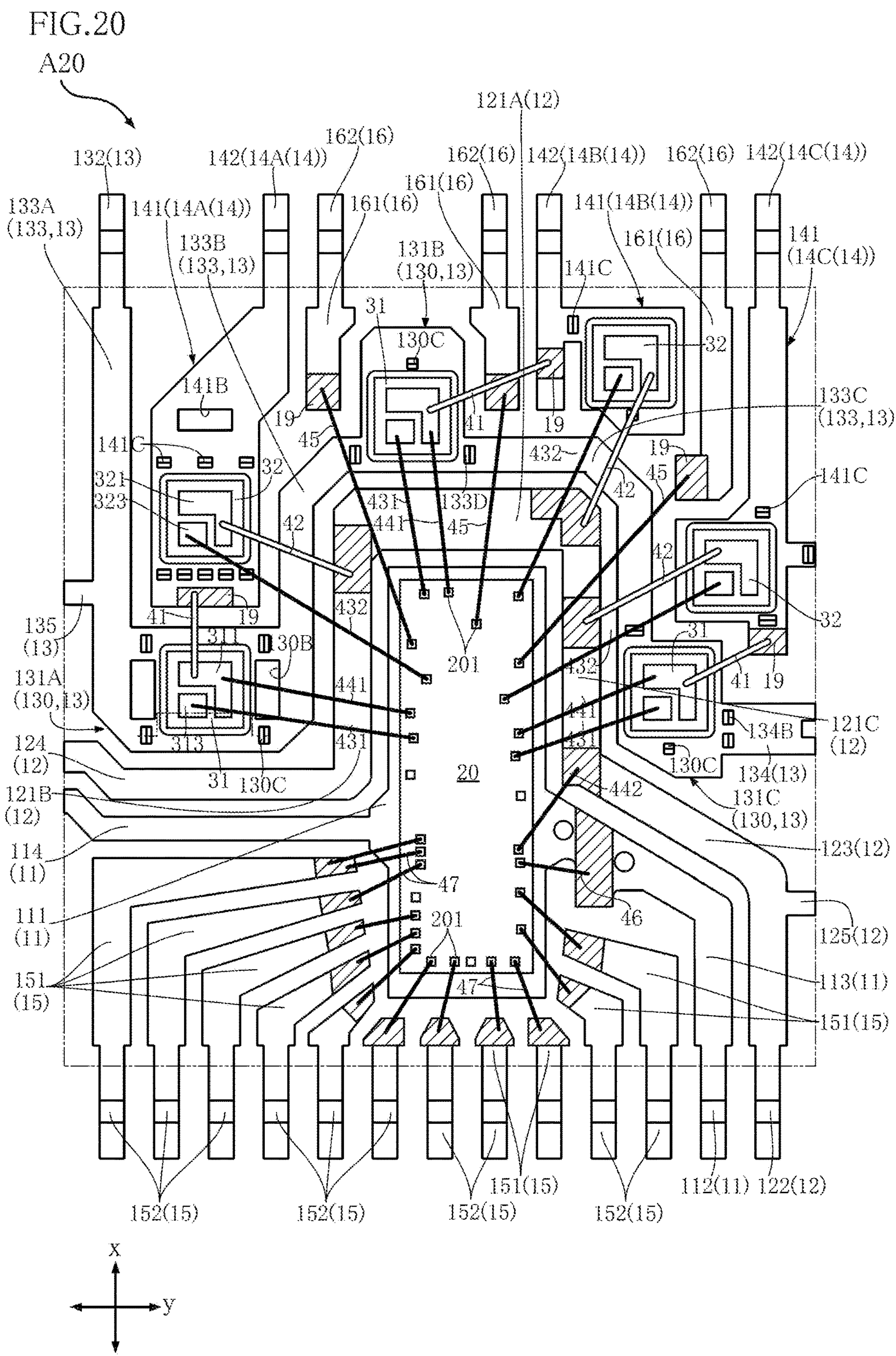
FIG. 20 is a plan view illustrating a semiconductor device according to a second embodiment of the present disclosure, with a sealing resin shown transparent.
Figure 21:
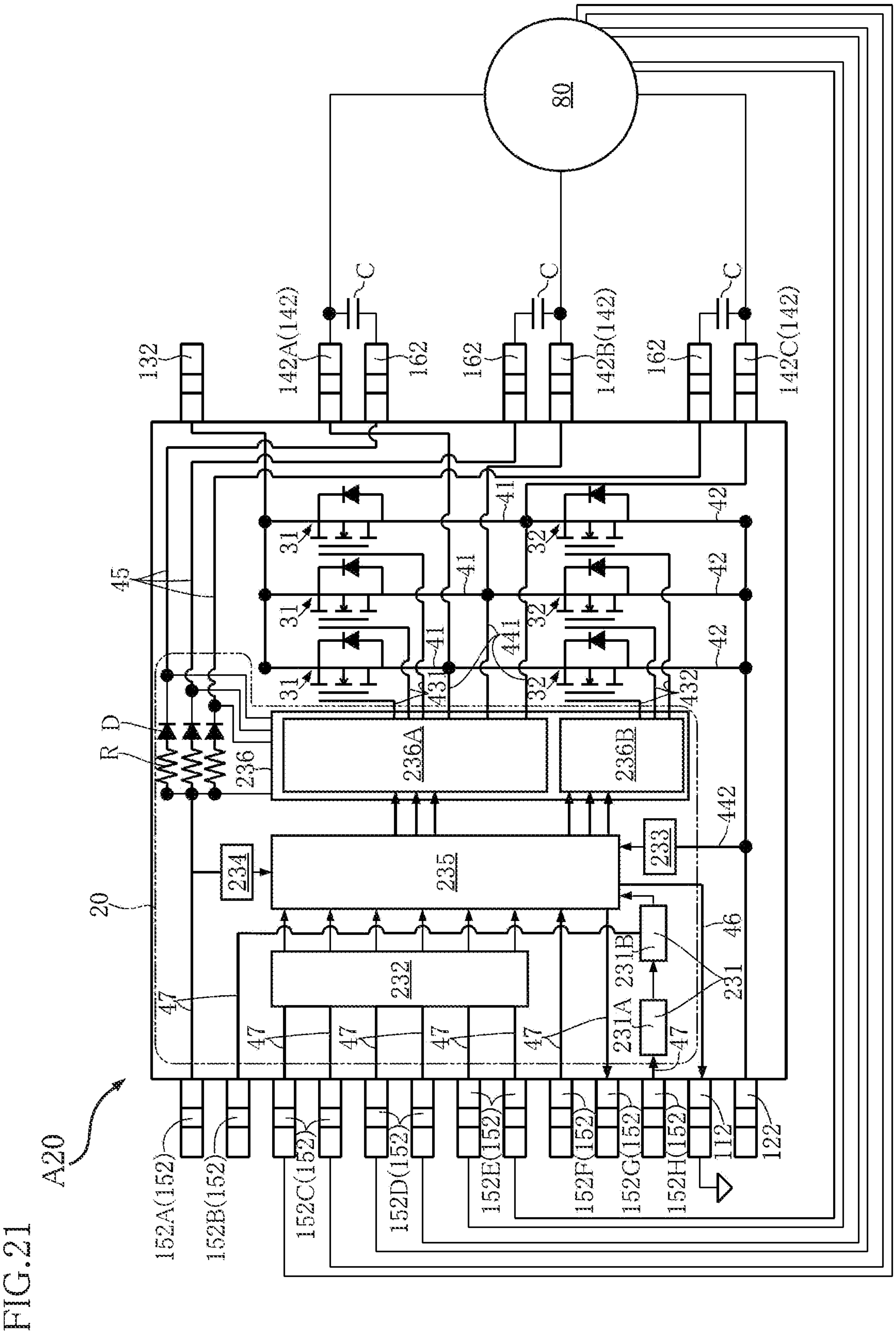
FIG. 21 is a functional block diagram illustrating the semiconductor device in FIG. 20.

Next, a semiconductor device A20 according to a second embodiment of the present disclosure will be described with reference to FIGS. 20 and 21. In these figures, elements that are the same as or similar to those of the semiconductor device A10 are denoted by the same reference signs and the descriptions thereof are omitted. In FIG. 20, the sealing resin 50 is shown transparent for convenience of understanding. Furthermore, the sealing resin 50 in FIG. 20 is indicated by an imaginary line.

The semiconductor device A20 is different from the semiconductor device A10 in the configuration of the IC 20. As shown in FIG. 20, the IC 20 is a single component. Thus, the semiconductor device A20 does not include the relay wires 48. As shown in FIG. 21, the IC 20 includes the first controller circuit 231, the Hall amplifier 232, the overcurrent protector 233, the voltage drop protector 234, the second controller circuit 235, and the driver circuit 236, which are described above.

As shown in FIG. 20, the IC 20 has a plurality of electrodes 201. One of the first gate wires 431, the second gate wires 432, the first potential wires 441, the second potential wire 442, the boot wires 45, the ground wires 46, and the wires 47 is bonded to each of the electrodes 201.

Next, advantages of the semiconductor device A20 will be described.

The semiconductor device A20 includes the fifth leads 15 spaced apart from the second lead 12 with the first lead 11 therebetween, and the wires 47 bonded to the IC 20 and the fifth leads 15. As viewed in the thickness direction z, the edge 151B of the fifth lead 15 closest to the second band-shaped portion 121B of the second lead 12 is positioned between the pair of first edges 121D of the second band-shaped portion 121B in the second direction y. Accordingly, the semiconductor device A20 can also achieve cost reduction. Furthermore, the semiconductor device A20 has configurations similar to the semiconductor device A10, whereby the semiconductor device A20 also has advantages owing to the configurations.

The present disclosure is not limited to the embodiments described above. Various design changes can be made to the specific configurations of the elements in the present disclosure.

The present disclosure includes the embodiments described in the following clauses.

Clause 1.

A semiconductor device comprising:

at least one IC;

a first lead having an island portion to which the IC is bonded;

a second lead having a first band-shaped portion, a second band-shaped portion, and a third band-shaped portion, the first band-shaped portion being spaced apart from the island portion in a first direction perpendicular to a thickness direction of the island portion, the first band-shaped portion extending in a second direction perpendicular to the thickness direction and the first direction, the second band-shaped portion being connected to the first band-shaped portion in a first sense of the second direction and extending in the first direction, the third band-shaped portion being connected to the first band-shaped portion in a second sense of the second direction and extending in the first direction;

a third lead spaced apart from the first lead with the second lead therebetween;

a plurality of first switching elements bonded to the third lead and electrically connected to the IC;

a plurality of fourth leads spaced apart from the second lead with the third lead therebetween, and electrically connected to the respective first switching elements;

a plurality of second switching elements bonded to the respective fourth leads and electrically connected to the IC and the second lead;

a plurality of fifth leads spaced apart from the second lead with the first lead therebetween; and a plurality of wires bonded to the IC and the plurality of fifth leads, wherein at least a part of the island portion is flanked by the second band-shaped portion and the third band-shaped portion, as viewed in the thickness direction, each of the fifth leads has an edge facing the island portion, as viewed in the thickness direction, the second band-shaped portion has a pair of first edges spaced apart from each other in the second direction and extending in the first direction, and as viewed in the thickness direction, the plurality of fifth leads include a closest fifth lead that is located closest to the second band-shaped portion, and the edge of the closest fifth lead is positioned between the pair of first edges in the second direction.

Clause 2.

The semiconductor device according to clause 1, wherein each of the fifth leads has an obverse surface facing in the thickness direction and including the edge of the fifth lead, and has a metal layer located between the obverse surface and a corresponding one of the plurality of wires, and as viewed in the thickness direction, at least a part of the metal layer on the obverse surface of the closest fifth lead is positioned between the pair of first edges in the second direction.

Clause 3.

The semiconductor device according to clause 1 or 2, wherein the at least one IC includes a first IC electrically connected to the plurality of fifth leads, and a second IC electrically connected to the first IC, the plurality of first switching elements, and the plurality of second switching elements, and the second IC is located between the first IC and the first band-shaped portion.

Clause 4.

A semiconductor device comprising:

a first IC;

a second IC spaced apart from and electrically connected to the first IC;

a first lead having an island portion to which the first IC and the second IC are bonded;

a second lead having a first band-shaped portion, a second band-shaped portion, and a third band-shaped portion, the first band-shaped portion being spaced apart from the island portion in a first direction perpendicular to a thickness direction of the island portion, the first band-shaped portion extending in a second direction perpendicular to the thickness direction and the first direction, the second band-shaped portion being connected to the first band-shaped portion in a first sense of the second direction and extending in the first direction, the third band-shaped portion being connected to the first band-shaped portion in a second sense of the second direction and extending in the first direction;

a third lead spaced apart from the first lead with the second lead therebetween;

a plurality of first switching elements bonded to the third lead and electrically connected to the second IC;

a plurality of fourth leads spaced apart from the second lead with the third lead therebetween, and electrically connected to the respective first switching elements;

a plurality of second switching elements bonded to the respective fourth leads and electrically connected to the second IC and the second lead;

a plurality of fifth leads spaced apart from the second lead with the first lead therebetween, and electrically connected to the first IC; and a sixth lead, wherein at least a part of the island portion is flanked by the second band-shaped portion and the third band-shaped portion, the first IC includes a first controller circuit that generates a PWM signal, and a second controller circuit that distributes the PWM signal to three phases, the second IC includes a driver circuit that drives the plurality of first switching elements and the plurality of second switching elements based on a signal from the second controller circuit, the plurality of fifth leads include a power supply terminal electrically connected to the second controller circuit and the driver circuit, the sixth lead is electrically connected to the driver circuit, and a voltage applied to the sixth lead is larger than a voltage applied to the power supply terminal.

Clause 5.

The semiconductor device according to clause 4, wherein the sixth lead is spaced apart from the second lead with the third lead therebetween.

Clause 6.

The semiconductor device according to clause 5, wherein the sixth lead is located next to one of the plurality of fourth leads in the second direction.

Clause 7.

The semiconductor device according to clause 5 or 6, wherein the second IC is located between the first IC and the first band-shaped portion in the first direction.

Clause 8.

The semiconductor device according to any of clauses 4 to 7, wherein the island portion is elongated in the first direction.

Clause 9.

The semiconductor device according to clause 8, further comprising a sealing resin covering the first IC, the second IC, the plurality of first switching elements, the plurality of second switching elements, and a part of each of the first lead, the second lead, the third lead, the plurality of fourth leads, and the plurality of fifth leads.

Clause 10.

The semiconductor device according to clause 9, wherein the first lead has a first terminal portion and a first connecting portion, as viewed in the thickness direction, the first terminal portion protrudes from the sealing resin in the first direction, the first connecting portion is located next to the third band-shaped portion in the first direction, and is connected to the island portion and the first terminal portion, and the first connecting portion is electrically connected to the first IC and the second IC.

Clause 11.

The semiconductor device according to clause 10, wherein the first connecting portion includes a region that is inclined relative to the first direction and the second direction.

Clause 12.

The semiconductor device according to clause 10 or 11, wherein the first connecting portion has a base connected to the island portion and the first terminal portion, and a tongue protruding from the base toward the plurality of fifth leads in the first direction, the base is electrically connected to the second IC, and the tongue is electrically connected to the first IC.

Clause 13.

The semiconductor device according to any of clauses 10 to 12, wherein the first lead has a first suspending portion located next to the second band-shaped portion in the first direction and connected to the island portion, and the first suspending portion extends in the second direction.

Clause 14.

The semiconductor device according to clause 13, wherein the second lead has a second terminal portion, a second connecting portion, and a second suspending portion, as viewed in the thickness direction, the second terminal portion protrudes from the sealing resin in the first direction, the second connecting portion is connected to the third band-shaped portion and the second terminal portion, and the second suspending portion is connected to the second band-shaped portion and extends in the second direction.

Clause 15.

The semiconductor device according to clause 14, wherein the second terminal portion is located next to the first terminal portion in the second direction.

Clause 16.

The semiconductor device according to clause 15, wherein the second connecting portion is located next to the first connecting portion, and the second suspending portion is located next to the first suspending portion.

Clause 17.

The semiconductor device according to clause 16, wherein the second connecting portion includes a region that is inclined relative to the first direction and the second direction.

REFERENCE SIGNS

A10, A20: Semiconductor device 11: First lead
111: Mounting portion 112: First terminal portion
113: First connecting portion 113A: Base
113B: Tongue 113C: Hole
114: First suspending portion 114A: End surface
12: Second lead 121A: First band-shaped portion
121B: Second band-shaped portion 121C: Third band-shaped portion
121D: First edge 121E: Second edge
122: Second terminal portion 123: Second connecting portion
124: Second suspending portion 125A: End surface
126: Second auxiliary suspending portion 126A: End surface
13: Third lead 130: First mounting portion
130A: Obverse surface 130B: Hole
130C: Groove 131A: First region
131B: Second region 131C: Third region
132: Third terminal portion 133: Third connecting portion
133A: Outer connecting portion
133B: First inner connecting portion
133C: Second inner connecting portion 133D: Groove
134: Third suspending portion 134A: End surface
134B: Groove 135: Third auxiliary suspending portion
135A: End surface 14: Fourth lead
14A: U-phase lead 14B: V-phase lead
14C: W-phase lead 141A: Obverse surface
141B: Hole 141C: Groove
141D: End surface 142: Fourth terminal portion
142A: U-phase output terminal 142B: V-phase output terminal
142C: W-phase output terminal 15: Fifth lead
151: Covered portion 151A: Obverse surface
151B: Edge 152: Fifth terminal portion
152A: VCC terminal 152B: VSP terminal
152C: HU terminal 152D: HV terminal
152E: HW terminal 152F: FGS terminal
152G: FG terminal 152H: RT terminal
16: Sixth lead 161: Covered portion
162: Sixth terminal portion 19: Metal layer
20: IC 201: Electrode
21: First IC 211: First electrode
22: Second IC 221: Second electrode
231: First controller circuit 231A: Triangular wave generator
231B: PWM signal converter 232: Hall amplifier
233: Overcurrent protector 234: Voltage drop protector
235: Second controller circuit 236: Driver circuit
236A: High-side region 236B: Low-side region
29: Bonding layer 31: First switching element
311: First obverse-surface electrode
312: First reverse-surface electrode
313: First gate electrode 32: Second switching element
321: Second obverse-surface electrode
322: Second reverse-surface electrode
323: Second gate electrode 39: Conductive bonding layer
41: First wire 42: Second wire
431: First gate wire 432: Second gate wire
441: First potential wire 442: Second potential wire
45: Boot wire 46: Ground wire
47: Wire 48: Relay wire
50: Sealing resin 51A, 51B: First side surface
52A, 52B: Second side surface 80: Motor
C: Capacitor C1: First capacitor
C2: Second capacitor R: Resistor
D: Diode z: Thickness direction
x: First direction y: Second direction

The invention claimed is:

1. A semiconductor device, comprising:

at least one IC;

a first lead having an island portion to which the IC is bonded;

a second lead having a first band-shaped portion, a second band-shaped portion, and a third band-shaped portion, the first band-shaped portion being spaced apart from the island portion in a first direction perpendicular to a thickness direction of the island portion, the first band-shaped portion extending in a second direction perpendicular to the thickness direction and the first direction, the second band-shaped portion being connected to the first band-shaped portion in a first sense of the second direction, an entirety of the second band-shaped portion extending in the first direction, and the third band-shaped portion being connected to the first band-shaped portion in a second sense of the second direction and extending in the first direction;

a third lead spaced apart from the first lead with the second lead therebetween;

a plurality of first switching elements bonded to the third lead and electrically connected to the IC;

a plurality of fourth leads spaced apart from the second lead with the third lead therebetween;

a plurality of second switching elements electrically bonded to the respective fourth leads and electrically connected to the IC and the second lead;

a plurality of fifth leads spaced apart from the second lead with the first lead therebetween; and a plurality of wires bonded to the IC and the plurality of fifth leads, wherein no leads other than the plurality of fifth leads are spaced apart from the second lead with the first lead therebetween, at least a part of the island portion is flanked by the second band-shaped portion and the third band-shaped portion, as viewed in the thickness direction, each of the fifth leads has an edge facing the island portion, as viewed in the thickness direction, the second band-shaped portion has a pair of first edges spaced apart from each other in the second direction and extending in the first direction, and as viewed in the thickness direction, the plurality of fifth leads include a closest fifth lead that is located closest to the second band-shaped portion in the first direction, and the edge of the closest fifth lead is positioned between the pair of first edges in the second direction.

2. The semiconductor device according to claim 1, wherein each of the fifth leads has an obverse surface facing in the thickness direction and including the edge of the fifth lead, and has a metal layer located between the obverse surface and a corresponding one of the plurality of wires, and as viewed in the thickness direction, a part of the metal layer on the obverse surface of the closest fifth lead is positioned between the pair of first edges in the second direction.

3. The semiconductor device according to claim 1, wherein the at least one IC includes a first IC electrically connected to the plurality of fifth leads, and a second IC electrically connected to the first IC, the plurality of first switching elements, and the plurality of second switching elements, and the second IC is located between the first IC and the first band-shaped portion.

4. A semiconductor device comprising:

a first IC;

a second IC spaced apart from and electrically connected to the first IC;

a first lead having an island portion to which the first IC and the second IC are bonded;

a second lead having a first band-shaped portion, a second band-shaped portion, and a third band-shaped portion, the first band-shaped portion being spaced apart from the island portion in a first direction perpendicular to a thickness direction of the island portion, the first band-shaped portion extending in a second direction perpendicular to the thickness direction and the first direction, the second band-shaped portion being connected to the first band-shaped portion in a first sense of the second direction and extending in the first direction, and the third band-shaped portion being connected to the first band-shaped portion in a second sense of the second direction and extending in the first direction;

a third lead spaced apart from the first lead with the second lead therebetween;

a plurality of first switching elements bonded to the third lead and electrically connected to the second IC;

a plurality of fourth leads spaced apart from the second lead with the third lead therebetween;

a plurality of second switching elements electrically bonded to the respective fourth leads and electrically connected to the second IC and the second lead;

a plurality of fifth leads spaced apart from the second lead with the first lead therebetween, and electrically connected to the first IC; and a sixth lead, wherein at least a part of the island portion is flanked by the second band-shaped portion and the third band-shaped portion, the first IC includes a first controller circuit that generates a PWM signal, and a second controller circuit that distributes the PWM signal to three phases, the second IC includes a driver circuit that drives the plurality of first switching elements and the plurality of second switching elements based on a signal from the second controller circuit, the plurality of fifth leads include a power supply terminal electrically connected to the second controller circuit and the driver circuit, the sixth lead is electrically connected to the driver circuit, and a voltage applied to the sixth lead is larger than a voltage applied to the power supply terminal.

5. The semiconductor device according to claim 4, wherein the sixth lead is spaced apart from the second lead with the third lead therebetween.

6. The semiconductor device according to claim 5, wherein the sixth lead is located next to one of the plurality of fourth leads in the second direction.

7. The semiconductor device according to claim 5, wherein the second IC is located between the first IC and the first band-shaped portion in the first direction.

8. The semiconductor device according to claim 4, wherein the island portion is elongated in the first direction.

9. The semiconductor device according to claim 8, further comprising:

a sealing resin covering the first IC, the second IC, the plurality of first switching elements, the plurality of second switching elements, and a part of each of the first lead, the second lead, the third lead, the plurality of fourth leads, and the plurality of fifth leads.

10. The semiconductor device according to claim 9, wherein the first lead has a first terminal portion and a first connecting portion, as viewed in the thickness direction, the first terminal portion protrudes from the sealing resin in the first direction, the first connecting portion is located next to the third band-shaped portion in the first direction, and is connected to the island portion and the first terminal portion, and the first connecting portion is electrically connected to the first IC and the second IC.

11. The semiconductor device according to claim 10, wherein the first connecting portion includes a region that is inclined relative to the first direction and the second direction.

12. The semiconductor device according to claim 10, wherein the first connecting portion has a base connected to the island portion and the first terminal portion, and a tongue protruding from the base toward the plurality of fifth leads in the first direction, the base is electrically connected to the second IC, and the tongue is electrically connected to the first IC.

13. The semiconductor device according to claim 10, wherein the first lead has a first suspending portion located next to the second band-shaped portion in the first direction and connected to the island portion, and the first suspending portion extends in the second direction.

14. The semiconductor device according to claim 13, wherein the second lead has a second terminal portion, a second connecting portion, and a second suspending portion, as viewed in the thickness direction, the second terminal portion protrudes from the sealing resin in the first direction, the second connecting portion is connected to the third band-shaped portion and the second terminal portion, and the second suspending portion is connected to the second band-shaped portion and extends in the second direction.

15. The semiconductor device according to claim 14, wherein the second terminal portion is located next to the first terminal portion in the second direction.

16. The semiconductor device according to claim 15, wherein the second connecting portion is located next to the first connecting portion, and the second suspending portion is located next to the first suspending portion.

17. The semiconductor device according to claim 16, wherein the second connecting portion includes a region that is inclined relative to the first direction and the second direction.

* * * * *